(12) United States Patent
Rohwer et al.

(10) Patent No.: US 10,178,756 B1
(45) Date of Patent: Jan. 8, 2019

(54) MULTIFUNCTIONAL COMPOSITE COATINGS FOR METAL WHISKER MITIGATION

(71) Applicant: National Technology & Engineering Solutions of Sandia, LLC, Albuquerque, NM (US)

(72) Inventors: Lauren E. S. Rohwer, Albuquerque, NM (US); James E. Martin, Tijeras, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 410 days.

(21) Appl. No.: 14/926,545

(22) Filed: Oct. 29, 2015

Related U.S. Application Data

(60) Provisional application No. 62/072,300, filed on Oct. 29, 2014.

(51) Int. Cl.
*B32B 15/04* (2006.01)
*H05K 1/02* (2006.01)
(Continued)

(52) U.S. Cl.
CPC ........... *H05K 1/0213* (2013.01); *B32B 15/04* (2013.01); *C09D 133/00* (2013.01); *C09D 163/00* (2013.01); *C09D 175/04* (2013.01); *C09D 183/04* (2013.01); *H05K 1/032* (2013.01); *H05K 1/0306* (2013.01); *H05K 1/09* (2013.01); *H05K 3/0091* (2013.01); *C08K 3/10* (2013.01); *C08K 3/18* (2013.01); *C08K 7/00* (2013.01);
(Continued)

(58) Field of Classification Search
CPC . C08K 3/10; C08K 3/18; C08K 13/02; C08K 13/04; C08K 13/06; C09K 2003/1087; C09K 5/00; C09K 5/02; H05K 1/0213
USPC ............................................ 252/71; 428/457
See application file for complete search history.

(56) References Cited

U.S. PATENT DOCUMENTS 5,827,906 A * 10/1998 Metzemacher .......... C08K 9/04
523/205
7,244,500 B2 7/2007 Watts et al.
(Continued)

FOREIGN PATENT DOCUMENTS

WO WO 2007143644 A1 * 12/2007 ............. C23C 30/00

OTHER PUBLICATIONS

Brusse, J., "Tin Whisker Observations on Pure Tin-Plated Ceramic Chip Capacitors", presented at the Electronics Finishing II Session and published in the official proceedings of AESF SUR/FIN 2002, Jun. 24-27, 2002, pp. 45-61, sponsored by the American Electroplaters and Surface Finishers Society, Orlando, FL. Posted with permission of the AESF.
(Continued)

*Primary Examiner* — Jane L Stanley
(74) *Attorney, Agent, or Firm* — Helen S. Baca; Mark A. Dodd

(57) ABSTRACT

The present invention relates to composite coatings including particles embedded in a matrix, as well as methods and uses thereof. In some examples, the particles are aligned to enhance mitigation of whisker formation from an underlying metal material. Such coatings can be applied to electrical components, thereby reducing the possibility of electrical short circuits from aberrant whisker growth.

19 Claims, 15 Drawing Sheets

(51) Int. Cl.
*H05K 3/00* (2006.01)
*C09D 175/04* (2006.01)
*C09D 133/00* (2006.01)
*C09D 163/00* (2006.01)
*C09D 183/04* (2006.01)
*H05K 1/03* (2006.01)
*H05K 1/09* (2006.01)
*C08K 7/00* (2006.01)
*C09K 5/00* (2006.01)
*C08K 3/18* (2006.01)
*C08K 13/06* (2006.01)
*C08K 3/10* (2018.01)

(52) U.S. Cl.
CPC ............... *C08K 13/06* (2013.01); *C09K 5/00* (2013.01); *H05K 2201/0158* (2013.01); *H05K 2201/0162* (2013.01)

(56) References Cited

U.S. PATENT DOCUMENTS

| | | | | |
|---|---|---|---|---|
| 7,604,871 | B2* | 10/2009 | Jackson | C23C 28/00 428/457 |
| 2007/0284700 | A1* | 12/2007 | Jackson | C23C 26/00 257/642 |
| 2007/0295530 | A1 | 12/2007 | Jackson et al. | |
| 2008/0216704 | A1* | 9/2008 | Eisenbeis | H05K 3/285 106/14.05 |
| 2010/0015437 | A1* | 1/2010 | Grothe | C08K 9/02 428/329 |
| 2013/0171405 | A1* | 7/2013 | Meschter | C23C 2/04 428/76 |
| 2018/0072897 | A1* | 3/2018 | Ashworth | C09D 7/62 |

OTHER PUBLICATIONS

Rohwer, L.E.S. et al., "Platelet Composite Coatings for Tin Whisker Mitigation", Journal of Electronic Materials, vol. 14, No. 11, 2015, pp. 4424-4433.
Woodrow, T., et al., "Evaluation of Conformal Coatings as a Tin Whisker Mitigation Strategy", IPC/JEDEC 8th International Conference on Lead-Free Electronic Components and Assemblies, San Jose, CA, Apr. 18-20, 2005,pp. 1-25.
Woodrow, T., et al., "Evaluation Conformal Coatings as a Tim Whisker Mitigation Strategy, Part II", Published in The Proceedings of SMTA International Conference, Rosemont, IL, Sep. 24-28, 2006, pp. 1-33.
Brusse, J.A. et al., "Tin Whiskers: Attributes and Mitigation", CARTS 2002: 22nd Capacitor and Resistor Technology Symposium,, Mar. 25-29, 2002, pp. 67-80.
Choudalakis, G. et al., "Marcomolecular Nanotechnology—Review Permeability of polymer/clay nanocomposites: A review", European Polymer Journal, 2009, vol. 45, pp. 967-987.
Galyon, G., "Annotated Tin Whisker Bibliography and Anthology", National Electronics Manufacturing Initiative, Inc., Nov. 2003, Version 1.2, pp. 1-64.
Han. S. et al., "Evaluation of Effectiveness of Conformal Coatings as Tin Whisker Mitigation", Journal of Electronic Materials, 2012, vol. 41, pp. 2508-2511.
Panashchenko, L et al., "Long Term Investigation of Urethane Conformal Coating Against Tin Whisker Growth", IPC Tin Whisker Conference, 2010, pp. 1-31.
Solis, K.J., et al., "Field-Structured Magnetic Platelets as a Route to Improved Thermal Interface Materials", Journal of Applied Physics, 2012, vol. 111, pp. 073507-1-073507-10.
De Pellegrin, D.V. et al., "Simulation of three-dimensional abrasive particles", Wear, vol. 258 (2005), pp. 208-216.
Earle, M.D., "The Electrical Conductivity of Titanium Dioxide", Phys. Rev., vol. 61 (1942), pp. 56-62.

* cited by examiner

US 10,178,756 B1

MULTIFUNCTIONAL COMPOSITE COATINGS FOR METAL WHISKER MITIGATION

CROSS-REFERENCE TO RELATED APPLICATION

This application claims the benefit of U.S. Provisional Application No. 62/072,300, filed Oct. 29, 2014, which is hereby incorporated by reference in its entirety.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to composite coatings including particles embedded in a matrix, as well as methods and uses thereof. In some embodiments, the particles are aligned to enhance mitigation of whisker formation from an underlying metal material.

BACKGROUND OF THE INVENTION

Environmental directives restricting lead usage in electronics has resulted in components being plated with pure tin instead of tin-lead alloys. Tin can grow whiskers (i.e., conductive filaments) that can cause electrical shorting in critical systems. Current coatings used for tin whisker mitigation are typically based on unfilled polymers, and tin whiskers can penetrate such coatings. Other metals are also capable of growing whiskers, such as zinc, silver, gold, etc. New coatings are needed to mitigate growth of whiskers, thereby preventing short circuits in electrical components.

SUMMARY OF THE INVENTION

We have demonstrated filled polymer coatings comprised of Ni and/or MgF$_2$-coated Ni particles (e.g., platelets) in epoxy or silicone for tin whisker mitigation. The platelets can arrange into sheets in the plane of the substrate surface, creating an impenetrable barrier. When tested under aging conditions that are known to promote whisker growth, whiskers had penetrated the unfilled silicone and the epoxy coatings, but the platelet composite coatings resisted whisker penetration. Platelets can enhance other properties of the composites, such as the in-plane thermal conductivity and out-of-plane gas permeability, enabling a new class of mitigation coatings.

Accordingly, in one aspect, the invention features a conductive component including: a metal layer formed from a whisker-forming material; and a conformal coating disposed on at least a portion of the metal layer. In some embodiments, the coating includes a matrix, which includes one or more polymers, and a plurality of particles embedded and/or aligned in the matrix. In further embodiments, the plurality of particles is oriented with respect to a surface of the metal layer. In yet other embodiments, an average projection of a particle director, which is a unit vector, normal to a surface of the metal layer is greater than about 0.5 (e.g., greater than about 0.6, 0.7, 0.8, 0.9, or 0.95) or of from about 0.4 to about 1 (e.g., from about 0.4 to 1, 0.5 to 1, 0.6 to 1, 0.8 to 1, 0.9 to 1, or 0.95 to 1). In some embodiments, the conformal coating (e.g., the plurality of particles of the conformal coating) is characterized by an order parameter S that is more about 0.25 or from about 0.5 to about 1.

In some embodiments, the conformal coating includes one or more layers of material, in which the layers form a coating that matches and/or preserves the shape and/or dimension of the underlying substrate (e.g., the underlying metal layer, or a portion thereof). In some instances, the conformal coating is disposed on an entire surface of the underlying substrate. In other instances, the conformal coating is sufficiently thick (e.g., having a thickness of from about 5 μm to about 200 μm) and/or sufficiently uniform in thickness (e.g. having a thickness variation of about 5% or less). In yet other instances, the conformal coating includes a plurality of layers, and each layer includes a plurality of particles. In further embodiments, each layer of the conformal coating (e.g., the plurality of particles of each layer of the conformal coating) is characterized by an order parameter S that is more about 0.25 or from about 0.5 to about 1.

In some embodiments, the whisker-forming material is tin or any described herein.

In some embodiments, the matrix includes epoxy, silicone, polyurethane, acrylic, urethane, parylene, or combinations or copolymers thereof.

In some embodiments, the plurality of particles includes platelets, flakes, ellipsoids, cuboids, parallelepipeds, rods, or combinations thereof. In other embodiments, each particle includes a major axis having a length scale b that is of from about 2 μm to about 200 μm, a minor axis having a length scale a that is of from about 0.5 μm to about 2 μm. In some embodiments, b is greater than a. In other embodiments, the ratio of b to a of from about 1000:1 to about 1:1 (e.g., greater than about 1:1 or about 5:1, such as from about 1000:1 to 5:1, 1000:1 to 10:1, 1000:1 to 50:1, 1000:1 to 100:1, or 1000:1 to 150:1).

In some embodiments, the plurality of particles includes one or more metallic particles, ceramic particles, polymeric particles, or combinations thereof. In further embodiments, each particle includes a coating (e.g., a coating including an inorganic coating, an organic coating, magnesium fluoride, a polyethylene glycol, a polyethylene oxide, a silica, a ceramic, and/or a fatty acid, such as any described herein).

In some embodiments, the conformal coating includes of from about 2 vol. % to about 10 vol. % particles. In other embodiments, the conformal coating includes a thickness of about 5 μm to about 200 μm (e.g., about 10 μm to 200 μm). In yet other embodiments, the conformal coating includes a plurality of layers embedded within the matrix, where each layer includes a plurality of particles.

In some embodiments, a contact angle between the matrix and a surface of the particle is more than about 90° (e.g., of from about 85° to about 170°).

In another aspect, the invention features a method of mitigating growth of whiskers on a conductive component. In some embodiments, the method includes (i) providing the conductive component including a metal layer, where the metal layer further includes a whisker-forming material; and (ii) applying one or more components of a conformal coating to at least a portion of a surface of the metal layer, where the conformal coating includes a matrix and a plurality of particles embedded and/or aligned in the matrix. In other embodiments, step (ii) results in an average projection of a particle director, which is a unit vector, normal to the surface of the metal layer that is greater than about 0.5.

In some embodiments, step (ii) includes extruding, painting, and/or spraying the one or more components of the conformal coating.

In other embodiments, the method further includes, prior to step (ii), combining each component of the conformal coating to form a composite mixture and then performing step (ii) by applying the composite mixture to at least a portion of the surface of the metal layer.

In yet other embodiments, step (ii) further including applying an energetic field (e.g., an electric field and/or a magnetic field) to the one or more components (e.g., thereby aligning the plurality of particles within the matrix).

In some embodiments, the method further includes providing a conductive component (e.g., any described herein).

For any embodiment herein, the conformal coating has beneficial penetration resistance, chemical stability, thermal stability, moisture resistance, low outgassing, low stress, high electrical insulation, thermal conductivity, and/or low gas permeability. In some embodiments, the conformal coating has a thermal conductivity of greater than about 1 W/m·K (e.g., of from about 0.8 W/m·K to about 3 W/m·K) and/or a specific conductivity enhancement of greater than about 50 (e.g., of from about 50 to about 200) and/or a specific dielectric enhancement of greater than about 100 (e.g., of from about 90 to about 200).

For any embodiment herein, the conformal coating is an electrical insulator or an electrical conductor.

For any embodiment herein, the component is a capacitor, a transistor, or an inductor.

Definitions

As used herein, the term "about" means+/−10% of any recited value. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

DETAILED DESCRIPTION OF THE INVENTION

The present invention relates to conformal coating capable of mitigating penetration of metal whiskers. The coating can also confer other beneficial characteristics, such as enhanced thermal conductivity, reduced gas permeability, etc. The coating generally includes a matrix and a plurality of particles dispersed within the matrix. Additional details follow.

Particles

The present invention includes the use of particles to mitigate whisker formation. In particular embodiments, the particle has a cross-section that is larger than spheres at a given loading. Due to this increased cross-section, a metal whisker is more likely to hit a particle than to penetrate the matrix in which the particles are embedded.

Figure 2A:
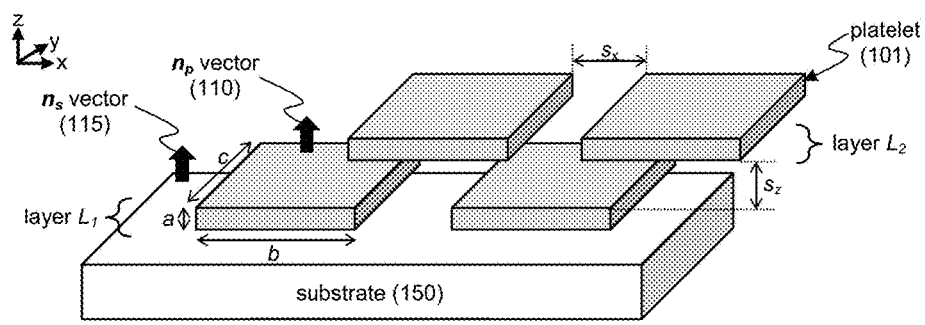
FIG. 2A-2D shows schematics of exemplary particles. Provided are (A) platelet particles 101 oriented in numerous layers $L_1$, $L_2$; (B) particles having cross-sections with a minor axis a and a major axis b; (C) particles characterized by an order parameter S; and (D) a conductive component 360 having a conformal coating 380, 385 disposed on a metal layer forming the lead 370, 375.

The particle can have any useful cross-section or other length scale(s). FIG. 2A-2D shows exemplary length scales for particles and composite coatings. As shown in FIG. 2A, the coating can include one or more platelet particles 101 embedded in a matrix, in which the coating is disposed upon a surface of a substrate 150. Each platelet can include one or more length scales, such as a length scale a along the minor axis of its cross-section, a length scale b along the major axis of its cross-section, and length scale c along its major face. In some embodiments, b is greater than a.

The coating can include multiple layers of particles. For instance, as shown in FIG. 2A, the exemplary coating includes a first layer L$_1$ and a second layer L$_2$, where each layer is separated by a distance s$_z$ and each platelet in each layer is separated by a distance s$_x$. Exemplary values for s$_z$ and s$_x$ include, independently, of from about 1 µm to 500 µm.

Figure 2B:
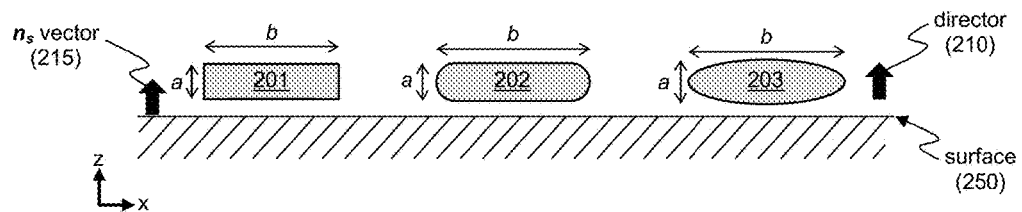

The particles can have any useful shape or cross-section. FIG. 2B provides exemplary cross-sections, such as for a cuboid 201 having a rectangular cross-section, a rounded cuboid 202 having a rounded rectangular cross-section, and an ellipsoid 203 having an elliptical cross-section. Each of these particles has a minor length scale a (along the minor axis of the cross-section) and a major length scale b (along the major axis of the cross-section), as well as a director 210 along its minor axis. In some embodiments, a plurality of particles, or a subset thereof, has its director positioned orthogonal to the plane of the applied surface 250 (e.g., a director positioned along the z axis, and the plane of the applied surface extending the x-y plane) or substantially parallel to a vector normal to the surface (e.g., the n$_s$ vector 215 in FIG. 2B). In other embodiments, the particle does not have a symmetrical cross-section (e.g., a circular cross-section in at least one plane). In yet other embodiments, the particle has a minor length scale a (along the minor axis of the cross-section) and a major length scale b, and a>b (e.g., for every cross-section of the particle, a>b).

Particle alignment or orientation can be described in any useful manner. In general, optimal alignment provides a particle director (e.g., a direction of a preferred orientation) that is a vector, which is orthogonal to the surface of the substrate (e.g., a metal layer including a whisker-forming material). The orientation of the particle, as compared to the particle director, can be described in any useful way. In one instance, the particle is described as having three length scales a, b, and c and three vectors a, b, and c (see, e.g., FIG. 2A). The descriptive vector for the particle can be described as a cross product of vector b and vector c, which is provided as the n$_p$ vector 110 in FIG. 2A. When a<b and a<c, then the n$_p$ vector is a vector that is normal to the major face of the particle. In this case, optimal alignment occurs when the n$_p$ vector is substantially parallel to a vector normal to the surface (e.g., the n$_s$ vector 115 in FIG. 2A) or orthogonal to the xy plane of the surface of the substrate 150. Put another way, this allows the major face of a particle (as described by the cross product of vector b and vector c) to be aligned to the planar surface of the substrate or metal layer.

When the particle director is a unit vector, alignment can also be described as an average projection of the particle director normal to a surface of the substrate (e.g., a metal layer, such as any described herein). In this case, alignment is optimized when the particle director is normal to the surface of the substrate, and the extent of alignment is characterized by an average projection that is greater than about 0.5. For instance, when each and every particle is perfectly aligned to the optimal orientation (i.e., with the minor axis normal to the plane of the surface), then the average projection will be 1.

Figure 2C:
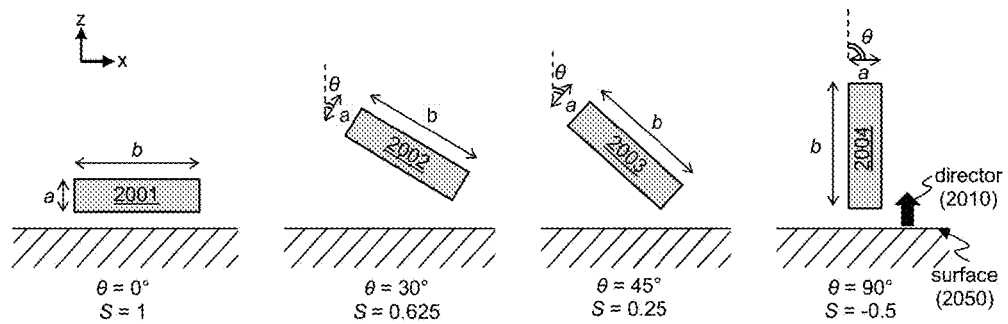

In yet another instance, alignment can be characterized by an order parameter, such as order parameter S employed to characterize liquid crystals (see, e.g., Joshi A A et al., "Measuring liquid crystal elastic constants with free energy perturbations," *Soft Matter* 2014; 10:882-93; Bharadwaj R K, "Modeling the barrier properties of polymer-layered silicate nanocomposites," *Macromolecules* 2001; 34:9189-92; and Larson R G (ed.), "The structure and rheology of complex fluids," Oxford University Press, 1998 ed. (Nov. 26, 1998), each of which is incorporated herein by reference in its entirety). For instance, order parameter S can be defined as Equation 1:

$$S = \left\langle \frac{3\cos^2\theta - 1}{2} \right\rangle, \qquad (1)$$

where θ is the angle between a particle orientation and the average particle director. A phase including ordered particles provides S=1, whereas a disordered phase provides S=0. As shown in FIG. 2C, for the composite structure herein, the average particle director 2010 can be taken to be a vector that is orthogonal to the surface 2050, and the particle orientation can be taken to be a vector along the minor axis a of a cross-section.

Four situations are provided in FIG. 2C (assuming that the provided particle represents an orientation that is representative of the average orientation of the plurality of particles). In the left panel, the particle orientation is described by a vector along a of the cross-section of a particle 2001. Angle θ between vector a and the director 2010 is 0, and thus S=1. For other particles 2002 and 2003, angle θ is greater than 0. As can be seen, as angle θ increases, order parameter S decreases. In another special case, when the particle 2004 is oriented to have an angle θ of 90°, S is −0.5. Such an orientation provides minimal protection against whisker formation and against whisker protrusion through the coating. Accordingly, in some embodiments, the plurality of particles is characterized by an order parameter S (e.g., an order parameter more than 0 or that is non-negative). In some embodiments, S is more than 0.25, 0.3, 0.4, 0.5, 0.75, or 0.9. In other embodiments, S is of from about 0.5 to about 1 (e.g., from about 0.6 to 1, 0.7 to 1.0, 0.8 to 1, or 0.9 to 1).

Figure 2D:
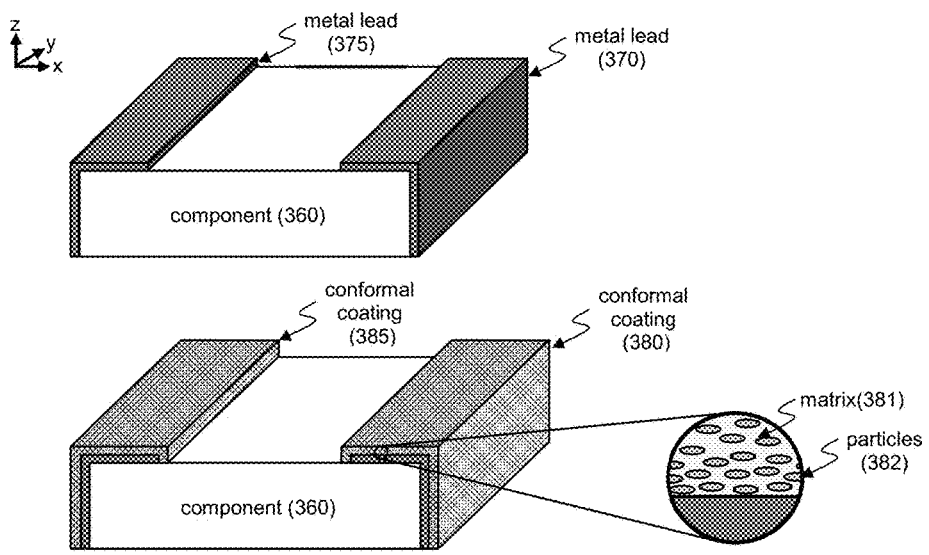

The particles can be disposed on any useful surface, such as a metal layer formed from a whisker-forming material. As shown in FIG. 2D, an exemplary surface includes those for a metal lead 370, 375 for a component 360 (e.g., a conductive component). The metal lead can be formed from any useful whisker-forming material (e.g., tin or a tin plating layer disposed above another metal layer). The coating of the invention includes a conformal coating 380, 385, which in turn includes a plurality of particles 382 disposed within a matrix 381. As described herein, the particles can be aligned in any useful manner.

The particle can be formed of any useful material. Exemplary materials included a metal (e.g., nickel) or a non-metal (e.g., a ceramic, such as silicon oxide, aluminum nitride, etc.) having an optional coating (e.g., an inorganic coating, such as a magnesium fluoride coating, such as a coating including magnesium difluoride; an insulative coating, such as a silica or any other dielectric; a ceramic coating, such as an aluminum oxide coating; a fatty acid coating, such as a saturated fatty acid coating, including those formed from stearic acid, palmitic acid, lauric acid, etc., or an unsaturated fatty acid coating (e.g., those formed from linoleic acid), as well as combinations thereof); or an organic coating, e.g., including a polyethylene glycol or a polyethylene oxide). Additional materials for particles, as well as coating for particles and methods for characterizing such particles, are described in U.S. Pub. No. 2013/0171405 and Rohwer L E S et al., "Platelet composite coatings for tin whisker mitigation," *J. Electron. Mater.* 2015; 44:4424-33, each of which is incorporated herein by reference in its entirety.

Matrix

The matrix can be any useful material capable of embedding and/or suspending the particles (e.g., any herein). Exemplary matrix materials include epoxy, silicone, polyurethane, acrylic, urethane, parylene, or combinations thereof, as well as any described in U.S. Pub. Nos. 2007/0295530 and 2008/0216704, each of which is incorporated herein by reference in its entirety.

Conformal Coating

The conformal coating of the invention can be applied on any useful surface. In some instances, the particles and matrix form a conformal coating, which in turn is disposed a metal layer including a whisker-forming metal. Exemplary whisker-forming metals include tin, gold, silver, zinc, cadmium, lead, indium, etc., as well as alloys thereof. The whisker-forming metal can, in turn, be disposed on a portion of a conductive component (e.g., a transistor, a capacitor, an inductor, etc.).

In addition to whisker mitigation, the conformal coating can also have one or more other beneficial characteristics. Such characteristics include, e.g., penetration resistance, chemical stability, thermal stability, moisture resistance, strong bonding to the applied surface, low outgassing, low stress, electrically insulating properties, heat spreading properties, low gas permeability, and/or reworkability. In particular embodiments, the conformal coating of the invention provides resistance to whisker penetration at any useful condition (e.g., ambient storage, constant temperature-humidity (e.g., storage at 60° C. and 93% RH), or temperature cycling (e.g., from −55° C. to 85° C.)) for an extended period (e.g., more than 1, 2, 3, 4, 5, 8, 10, or more years).

Methods of Making and Using Conformal Coatings

The present invention also includes methods for making, using, and/or testing conformal coatings. The coating can be applied to a desired surface in any useful manner. For instance, such coatings can be applied by painting or spraying a surface with a mixture including a matrix and a plurality of particles. This application step can be employed numerous times (e.g., 2, 3, 5, 7, 10, etc.) to obtain a coating of a desired thickness (e.g., a thickness of about 1 μm, 5 μm, 10 μm, 25 μm, 50 μm, 100 μm, 200 μm, etc., as well as ranges therein, such as of from about 1 μm to about 200 μm, e.g., from 1 μm to 100 μm, 10 μm to 100 μm, 20 μm to 100 μm, 10 μm to 200 μm, or 20 μm to 200 μm).

In one embodiment, one or more particles in the coating are aligned, and then the matrix is treated or cured, thereby providing a conformal coating having aligned particles. In some instance, aligned particles require that each particle has a director along a minor axis and that at least 90% of each director is positioned orthogonally to an applied surface.

Particles can be aligned in any useful manner. In one example, the particles are ferromagnetic, and the particles are aligned by applying an external magnetic or electric field (e.g., a structuring energetic field, such as an ac biaxial magnetic field or a triaxial energetic field). Exemplary methods for tuning and/or applying energetic fields to materials and/or structures are described in U.S. Pat. Nos. 6,194,769, 6,391,393, 6,290,868, 6,844,378, and 8,562,878, as well as Martin J E et al., "Field-structured composites for efficient, directed heat transfer," *J. Appl. Phys.* 2009; 106: 084301 (7 pp.); Solis K J et al., "Field-structured magnetic platelets as a route to improved thermal interface materials," *J. Appl. Phys.* 2012; 111:073507 (10 pp.); and Martin J E et al., "Field-structured, multilayered platelets enable high performance, dielectric thermal composites," *J. Appl. Phys.* 2012; 112:054306 (10 pp.), each of which is incorporated herein by reference in its entirety.

In another example, the matrix is chosen such that it does not wet the particle (e.g., where a contact angle between the matrix and a surface of the particle is more than about 90°), thereby allowing intermolecular interaction to arrange the particles in an aligned manner at the interface between the matrix and the surface of the metal layer to which the conformal coating is applied. In yet another example, the matrix and particles are combined to form a mixture, and the mixture is extruded through an orifice having an opening that is larger than a length scale a along the minor axis but is smaller than a length scale b along the major axis. In this manner, extrusion of the mixture results in alignment of the particles, where this extruded mixture can then be deposited on a desired surface. A skilled artisan would understand that other deposition procedures can be employed to align the particles and/or apply the conformal coating to the desired surface.

In another embodiment, the conformal coating is provided as a cured layer having a top surface and a lower surface, where the lower surface includes an adhesive (e.g., a pressure sensitive adhesive) that binds the coating to a desired surface.

The conformal coating can be employed in any useful manner. For instance, the coating can be applied on any surface composed of a whisker-forming material (e.g., any described herein).

EXAMPLES

Example 1: Multifunctional Composite Coatings Containing Oriented Platelets for Tin Whisker Mitigation The removal of lead from electronics to comply with Restriction of Hazardous Substances (RoHS) directives has resulted in components being plated with pure tin. This shift to pure tin plating has created an immediate threat to the long-term reliability of electronic systems for weapons, satellites, military, automotive, and medical applications. Tin whiskers can lead to electrical shorting or metal vapor arcing that can cause critical systems to fail catastrophically (McDowell M E, "Tin whiskers: A case study," 1993 *IEEE Aerospace Appl. Conf Dig.* 1993:207-15; and Brusse J A et al., "Tin whiskers: Attributes and mitigation," *Proc. 22$^{nd}$ Capacitor and Resistor Technol. Symp.*, held on 25-29 Mar. 2002, pp. 67-80, available at http://nepp.nasa.gov/whisker/reference/tech_papers/brusse2002-paper-tin-whiskers-attributes-an d-mitigation.pdf (last accessed 23 Oct. 2014)). Because the mechanisms of tin whisker growth are unclear, lifetime predictions are uncertain, so the development of robust tin whisker mitigation methods is currently the best approach to eliminate this risk.

Polymer coatings are currently being investigated for tin whisker mitigation. The current approach uses single-phase, unfilled polymers, but these are not impenetrable to tin whiskers (Panashchenko L et al., "Long term investigation of urethane conformal coating against tin whisker growth," *IPC Tin Whisker Conf*, held on 7 Dec. 2010 (31 pages), available at http://nepp.nasa.gov/whisker/reference/tech_papers/2010-Panashchenko-IPC-Tin-Whisker.pdf (last accessed 22 Oct. 2014); Ogden R R et al., "Tin whisker observations," *Circuits Assembly* 2009 November; 20(11): 26-9; Han S et al., "Tin whisker growth on conformally coated SnPb assemblies," 4$^{th}$ *Int'l Symp. on Tin Whiskers*, held on 23-24 Jun. 2010, available at http://www.calce.umd.edu; Hunt C et al., "Measuring the mitigation capability of conformal coatings: Part 2," 4$^{th}$ *Int'l Symp. on Tin Whiskers*, held on 23-24 Jun. 2010, available at http://www.calce.umd.edu; Nakagawa T et al., "Evaluation of conformal coating for mitigation of tin whisker growth (Part II)," 4$^{th}$ *Int'l Symp. on Tin Whiskers*, held on 23-24 Jun. 2010, available at http://www.calce.umd.edu; Hunt C et al., "Mitigation of tin whiskers with polymer coatings," 2010 *Int'l Symposium on Adv. Packaging Mater. Microtech*, held on 28 Feb.-2 Mar. 2010, pp. 78-87; and Han S et al., "Evaluation of effectiveness of conformal coatings as tin whisker mitigation," *J. Electron. Mat.* 2012; 41(9):2508-18).

Researchers have conducted extensive studies of polyurethane coatings (Uralane® 5750) and have summarized the outcome of an 11 year study (Panashchenko L et al., Long term investigation of urethane conformal coating against tin whisker growth, "*IPC Tin Whisker Conf*, held on 7 Dec. 2010). Tin whiskers eventually grew long enough to penetrate thin coatings (0.1 mil thick). Thicker coatings (0.5 and 2 mil) were found to have resisted penetration for 11 years under ambient storage conditions, although there is evidence that the growing whiskers are trying to penetrate: nodular protrusions and sharp, tentlike projections appear in the polymer.

Single-phase, rubbery polymers have been found to be less penetration resistant in humid environments. A 1 mil thick coating of Uralane® 5750 at 50° C./50% relative humidity (RH) was penetrated by tin whiskers after 5 years, as were 1 mil thick acrylic coatings (Panashchenko L et al., Long term investigation of urethane conformal coating against tin whisker growth," *IPC Tin Whisker Conf.*, held on 7 Dec. 2010). Such coatings rely on the whiskers growing long enough to undergo 'Euler buckling' before they penetrate the coating. An unwanted consequence of this approach is coating deformation caused by the growing whisker pushing up on the polymer creating protrusions and sharp projections that can lead to polymer debonding.

Glassy polymers have greater penetration resistance than rubbery polymers, and in fact, tin whiskers did not penetrate a 0.5 mil thick Parylene C coating after 5 years at 50° C./50% RH (Panashchenko L et al., Long term investigation of urethane conformal coating against tin whisker growth," *IPC Tin Whisker Conf.*, held on 7 Dec. 2010; and Han S et al., "Tin whisker growth on conformally coated SnPb assemblies," 4$^{th}$ *Int'l Symp. on Tin Whiskers*, held on 23-24 Jun. 2010) and after sequential thermal cycling and elevated temperature-humidity exposure (Han S et al., *J. Electron. Mat.* 2012; 41(9):2508-18). However, stress evolution during thermal cycling remains an issue for glassy polymers, as does device rework. Glassy and rubbery polymers are poor heat conductors, so there is a concern that devices coated with such materials could overheat during use.

There is a need for coatings that significantly increase the penetration resistance of polymers and enhance other properties of the polymer such as the in-plane thermal conductivity and the dielectric properties; and reduce the out-of-plane gas permeability, to create a new class of multifunctional tin whisker mitigation coatings for electronic systems that use tin-plated components or tin-containing solders.

The present invention describes new composite coatings for tin whisker mitigation for electronic systems. The composite coating is comprised of a polymer resin into which platelet-shaped particles are incorporated to improve the penetration resistance. The platelets can be metallic or non-metallic. Platelets were selected because they have a higher cross section than spherical particles at a given loading, and are thus more likely to stop the growing whiskers. When arranged into sheet-like layers, the platelets create a multilayer barrier resembling scale armor found in nature. In fact, a multilayer platelet composite is the secret to the high fracture toughness of seashells and the penetration resistance of the toucan beak (Meyers M A et al., "Structural biological materials: Critical mechanics-materials connections," *Science* 2013 February; 339(6121):773-9).

Figure 1A:
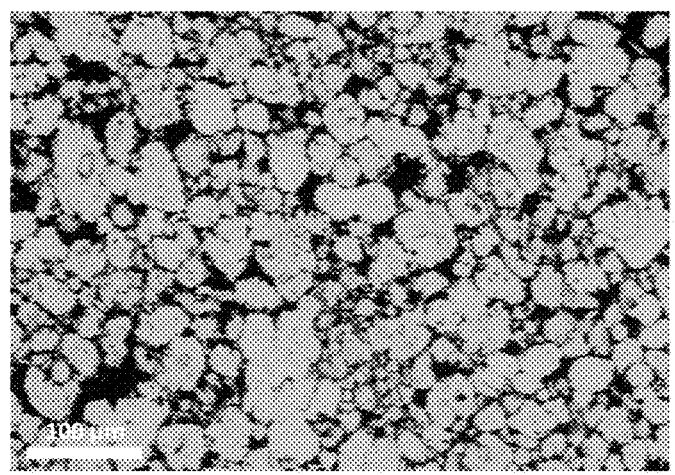
FIG. 1A-1D shows scanning electron microscope (SEM) images of various composite coatings. Provided are (A) nickel platelets (gray) oriented in epoxy (in black) in a manner that maximizes the penetration resistance of the coating; (B) nickel platelets (gray) in epoxy (in black) oriented in a manner that is less effective at blocking tin whiskers; (C) platelets (dark gray) having in-plane orientation; and (D) nickel platelets (in gray) oriented in epoxy (in black) conformally coating the curved surface of a transistor lead.
Figure 1B:
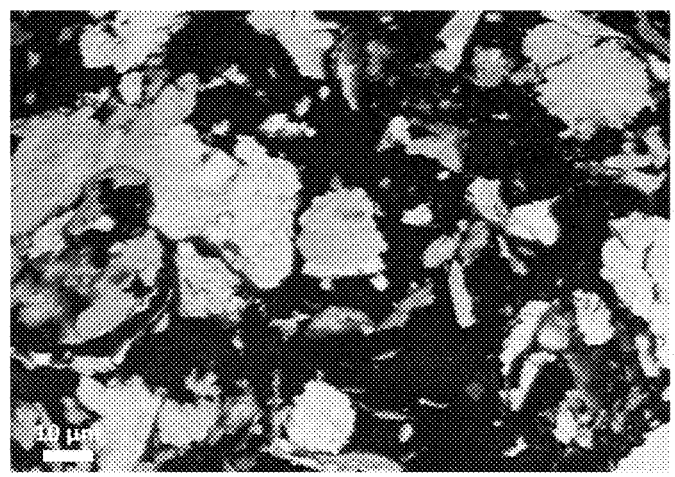
Figure 1C:
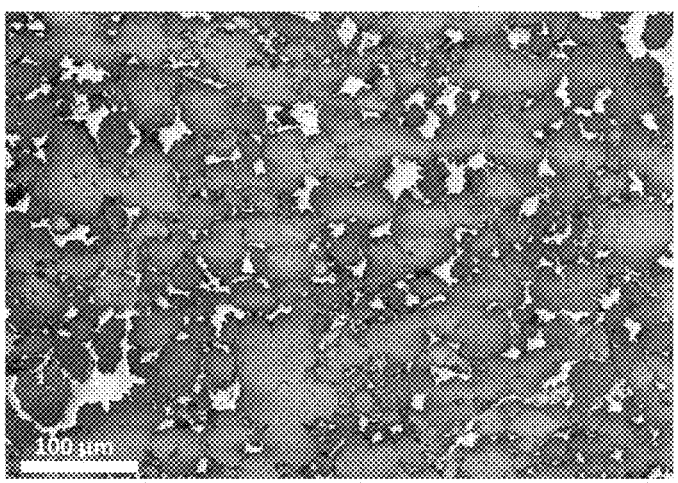
Figure 1D:
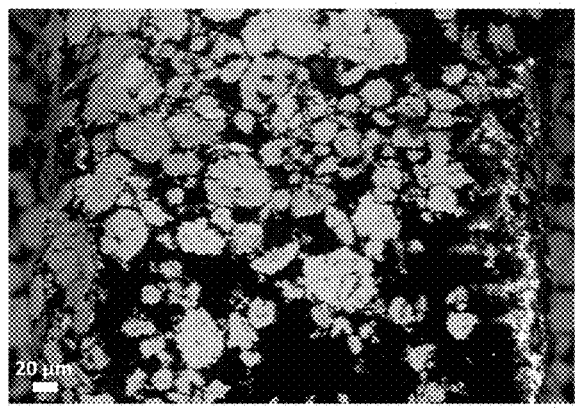

The platelet orientation relative to the whisker-growing surface is a key to the invention. Platelets oriented with their director normal to the surface of the coating, as shown in FIG. 1A and FIG. 1C for a nickel (Ni) platelet composite present an impenetrable barrier to the growing whiskers. The coating that results resembles scale armor. Misoriented platelets as shown in FIG. 1B are less effective at blocking tin whiskers. Curved surfaces can be coated conformally with the composite, maintaining the platelet orientation, as shown in FIG. 1D.

There are many ways to control the platelet orientation in our composites including: surface modification to prevent the polymer from wetting the platelet surface; extrusion; and applying magnetic or electric fields. The platelet composite coating can be applied to surfaces by brushing or spraying.

The composite can also be fabricated as a free-standing film that can be applied to the surface by vacuum pressing or with a secondary adhesive.

As will be discussed herein, the invention also encompasses other interesting property enhancements made possible by selecting platelets as the filler particles and controlling their orientation. The platelet composites are thus multifunctional.

Tin Whisker Mitigation Experiments:

The tested composites included nickel platelets or magnesium fluoride ($MgF_2$)-coated nickel platelets in silicone or epoxy, but other platelet compositions can be used, as well as other types of polymers.

Tin whisker mitigation experiments used tin-plated copper coupons. The coupons were plated in a manner that leads to abundant whisker growth. When coated with epoxy or nickel platelet-filled epoxy, no whiskers were observed after four years at ambient conditions. The penetration resistance of nickel was evaluated using tin-plated copper coupons. In these experiments the copper was first plated with nickel, then tin, then with a final overlayer of nickel. No whiskers were observed after 3.5 years at ambient conditions and 500 cycles (from −55° C. to 125° C.) and 1,000 cycles (from −55° C. to 85° C.).

Tin whisker mitigation experiments used commercial capacitors having tin-plated terminations, and commercial transistors having tin-plated leads. The capacitors and transistors were exposed to aging conditions that promote whisker growth: 60° C. and 93% RH and from −55° C. to 85° C. thermal cycling.

Figure 3A:
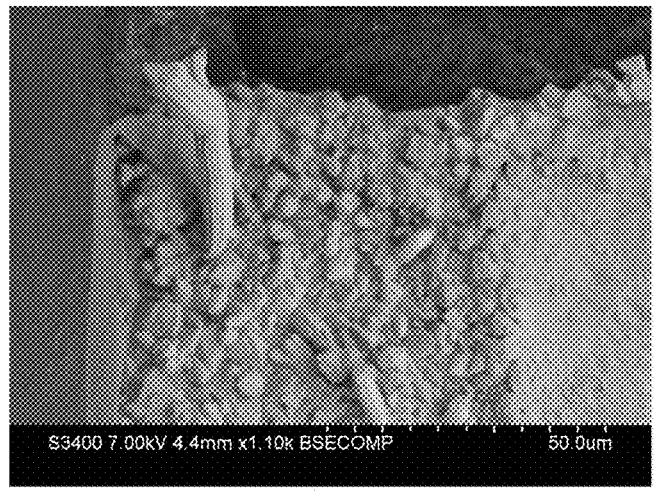
FIG. 3A-3C shows SEM images of tin whiskers and protrusions. Provided are (A) tin whiskers on a bare transistor lead after 4,000 hours at 60° C. and 93% relative humidity (RH); (B) tin whiskers penetrating an epoxy coating on transistor leads after 4,000 hours at 60° C. and 93% RH; and (C) a protrusion in epoxy created by a platelet during 500 temperature cycles from −55° C. to 85° C., where such protrusions can occur if the platelets are randomly oriented in the polymer.
Figure 3B:
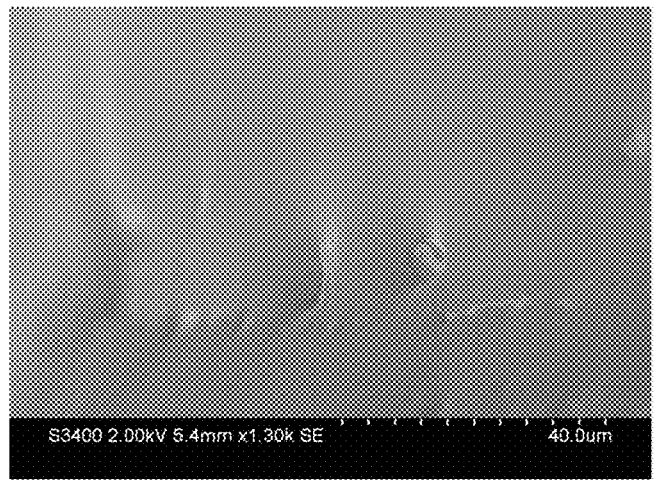

Tin Whisker Mitigation Experiments Under Elevated Temperature and High Humidity:

Unfilled epoxy and silicone coatings were applied to commercial tin-plated capacitors and transistors then the components were exposed to 60° C. and 93% RH for 4,000 hours. No whiskers penetrated capacitors that were coated with epoxy or silicone, but started to penetrate the epoxy coating on some transistor leads (FIG. 3B). In contrast, bare transistor leads had abundant whisker growth (FIG. 3A).

Nickel platelet-epoxy and nickel platelet-silicone composite coatings on capacitors and transistors were exposed to 60° C. and 93% RH. After 4,000 hours, there was no evidence of tin whiskers penetrating the coatings.

The nickel platelet-epoxy composite coating was included in a tin whisker mitigation coating evaluation. The platelet composite coating was tested on tin-plated brass and tin-plated copper coupons for 500 hours at 85° C. and 85% RH. There was no evidence of tin whiskers penetrating the nickel platelet composite coated regions, but whiskers did grow on the uncoated regions of the coupons.

Figure 4A:
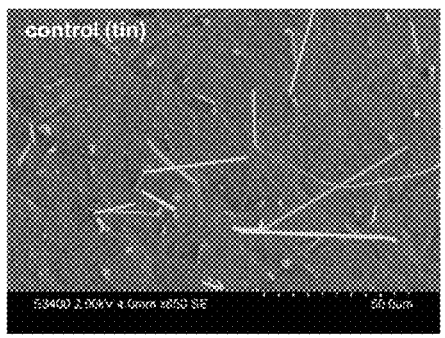
FIG. 4A-4E shows SEM images of coatings. Provided are (A) a control sample showing whisker formation after 3 months, where shown is an electroplated tin sample on copper; (B) a test sample with an unfilled silicone coating (i.e., lacking platelet particles) after 500 temperature cycles; (C) a test sample with an unfilled epoxy coating (i.e., lacking platelet particles) after 500 temperature cycles; (D) a test sample with a platelet composite coating ($MgF_2$-coated nickel platelets in silicone) showing no whisker penetration even after 1,500 temperature cycles; and (E) a control test sample of a Ni-plated test coupon. For these coatings, each temperature cycle included a temperature ramp from −55° C. to 85° C.
Figure 4B:
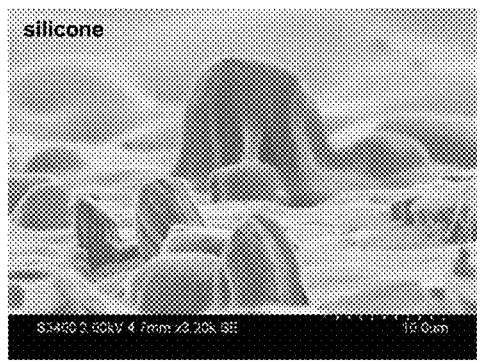
Figure 4C:
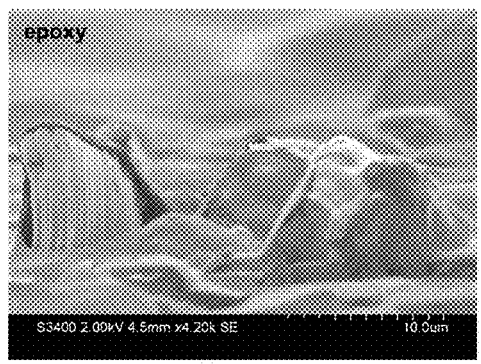

Tin Whisker Mitigation Under Temperature Cycling Conditions:

Silicone and epoxy coatings were tested on capacitors and transistors in a thermal cycling environment that is known to promote whisker growth (−55° C. to 85° C.). A control surface lacking any coating had abundant whisker growth (FIG. 4A). After 500 cycles, tin whiskers had penetrated both polymers (FIG. 4B-4C). We also observed protrusions in the coatings where whiskers were trying to penetrate. Upon re-inspection after the duration of the test (1,500 cycles), more whiskers had penetrated both polymers.

Figure 4D:
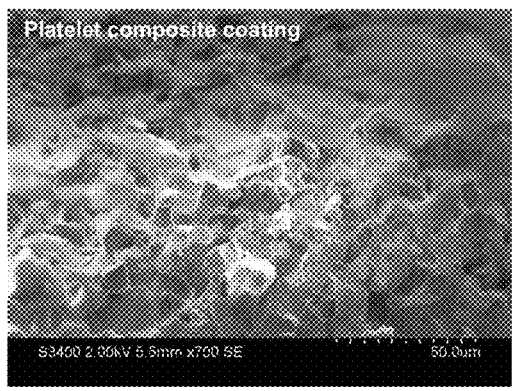

Tin whiskers did not penetrate silicone or epoxy coatings that contained the nickel or $MgF_2$-coated nickel platelets. The SEM image of FIG. 4D shows the coating after 1,500 temperature cycles. There was no evidence of tin whisker growth, and the platelets maintained the desired orientation.

Figure 3C:

Randomly oriented nickel or $MgF_2$-coated nickel platelets can create protrusions in the polymer. In thermal cycling experiments, $MgF_2$-coated nickel platelet-epoxy composites showed protrusions after 500 cycles, as shown in FIG. 3C.

Figure 5A:
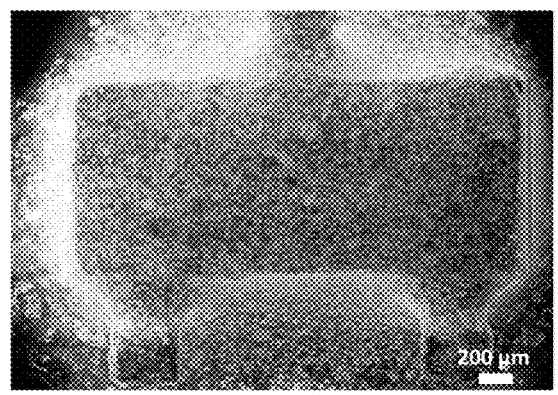
FIG. 5A-5D shows SEM images of a transistor having a hand-painted conformal coating, which includes 4 vol. % platelets in an epoxy matrix. Provided are (A) an image of the transistor; (B) a magnified SEM image of a terminal of the transistor; (C) an SEM image in back-scattered electron imaging mode of the terminal shown in (B), which shows the in-plane orientation of the platelets (light gray) and the epoxy resin (black region) between the platelets; and (D) a cross-sectional image of coated transistor lead in BSE imaging mode, in which the platelets at the surface of coating are aligned parallel to the tin surface. Gaps in coverage can be eliminated by adding additional layers of the conformal coating.
Figure 5B:
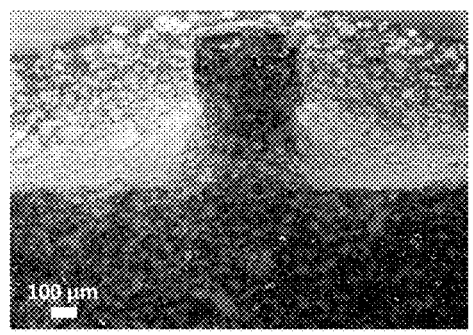
Figure 5C:
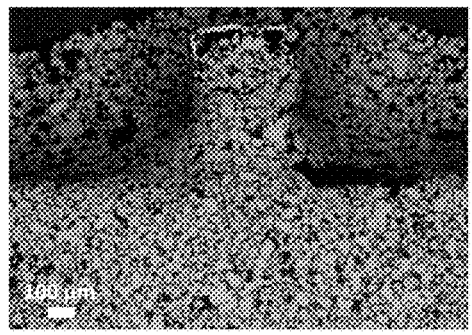
Figure 11A:
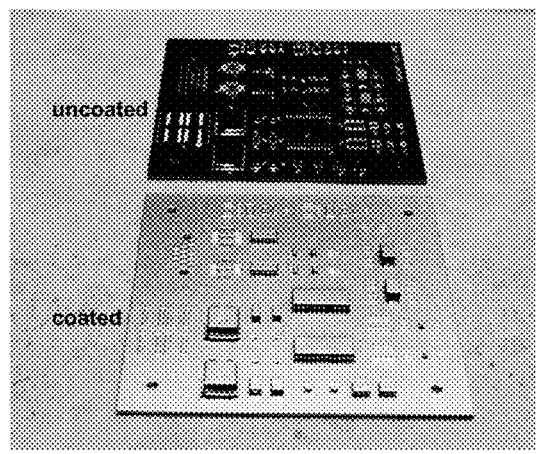
FIG. 11A-11B shows photographs of conductive components having a conformal coating. Provided are (A) a circuit board that is uncoated (top) or coated (bottom) with five coats of a platelet composite coating, thereby providing a conformal coating having a thickness of about 55 μm and (B) a capacitor termination that is uncoated (left) or coated (right) over a tin-plated surface with a platelet composite coating.
Figure 11B:
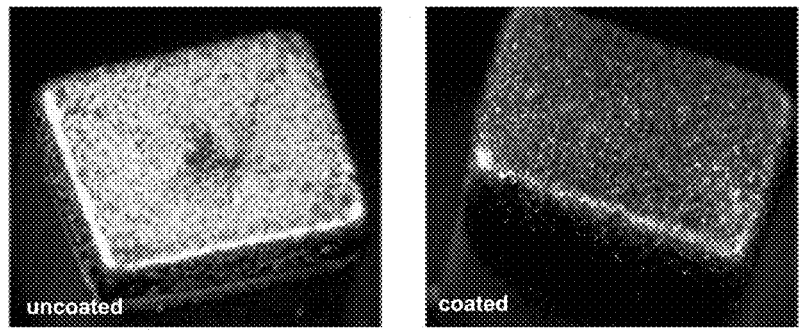

Conformal Coatings:

Transistors were hand-painted with a component mixture having 4 vol. % platelets in an epoxy matrix (FIG. 5A). As can be seen, platelets aligned parallel to the transistor surface (FIG. 5B), i.e., with a director orthogonal to the plane of the surface. Platelet aligned was also observed in back-scattered electron imaging mode (FIG. 5C). Any observed gaps in coverage (as shown by dark regions in FIG. 5C) can be eliminated by adding or applying additional layers. Coated components are shown in FIG. 11A-11B.

Property Enhancements in Oriented Platelet Composites:

As described in the previous sections, the use of platelets that are properly oriented can lead to a substantial increase in the penetration resistance of polymer composites and differentiates our approach from other filled polymer concepts. Other differentiating attributes of the platelet composites approach are described in the following.

Thermal Conductivity—

Thermal interface materials are typically made by adding thermally conductive, spherical particles to a polymer resin. Only modest conductivity enhancements accrue because a sphere almost completely excludes the thermal gradient. Aligned platelets do not effectively exclude the thermal gradient, and so are a much more effective shape (Solis K J et al., "Field-structured magnetic platelets as a route to improved thermal interface materials," J. Appl. Phys. 2012; 111:073507 (10 pp.)).

Figure 7:
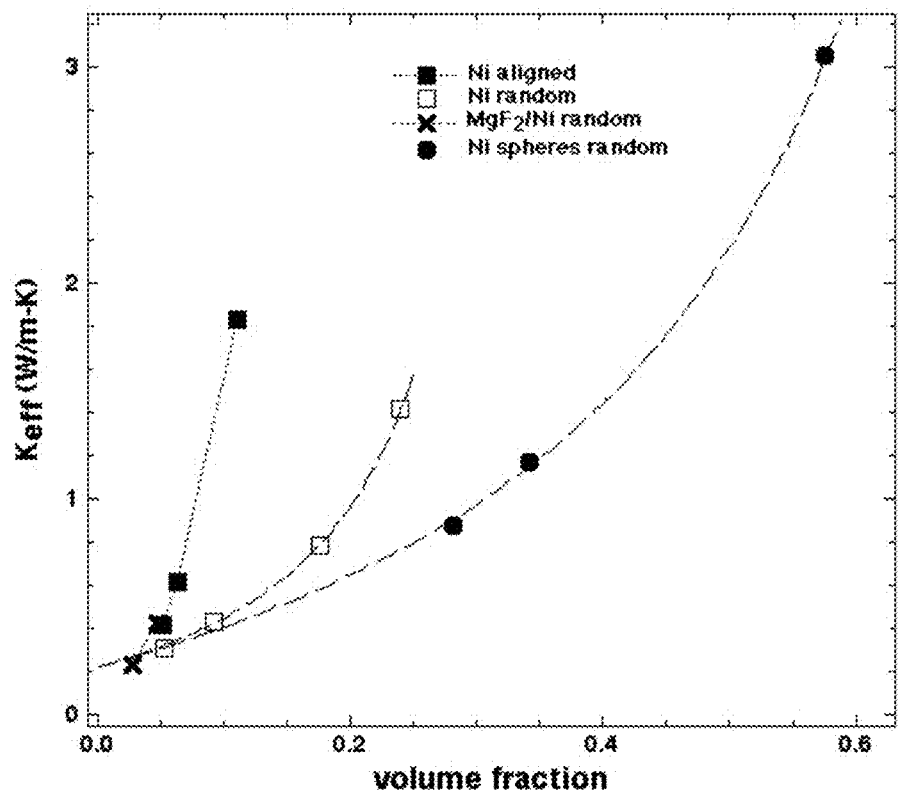
FIG. 7 is a graph showing effective thermal conductivity ($K_{eff}$) as a function of particle loading for nickel platelet and nickel sphere composites having randomly oriented or aligned particles.

Platelet composites were made that have a thermal conductivity of 1.8 W/m·K (epoxy alone is 0.21 W/m·K). This enhancement in the thermal conductivity was achieved with only 11 vol. % of nickel platelets. FIG. 7 is a plot of the effective thermal conductivity of the composite ($K_{eff}$). The virial expansion for the effective composite thermal conductivity is shown in Equation 2:

$$\frac{K_{eff}}{K_{poly}} = 1 + \alpha \varphi_p, \qquad (2)$$

where $\alpha$ is the first virial coefficient and $\varphi_p$ is the volume fraction of particles. For spherical particles of infinite thermal conductivity, $\alpha=3$ (Solis K J et al., "Field-structured magnetic platelets as a route to improved thermal interface materials," J. Appl. Phys. 2012; 111:073507 (10 pp.)), so adding 10 vol. % of diamond powder (K~2000 W/m·K) to epoxy would raise the thermal conductivity to only ~0.3 W/m·K, a negligible increase. As can be seen, the coefficient values $K_{eff}$ of composites with aligned nickel platelets are higher than those with random nickel platelets at a given filler loading. High loadings are required for sphere-filled composites to attain $K_{eff}$ values comparable to those of platelet-filled composites.

Figure 8A:
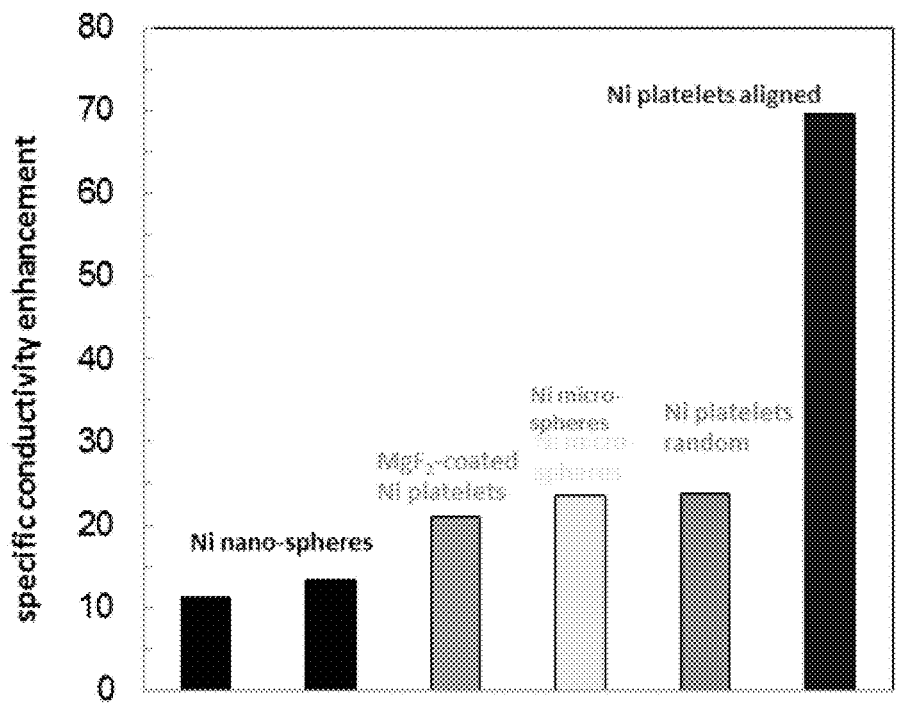
FIG. 8A-8B shows enhancement graphs of composites made with nickel platelets or $MgF_2$-coated nickel platelets. Provided are (A) measurements of specific conductivity enhancement; and (B) measurements of specific dielectric enhancements for composites made with platelets that are much larger than the sphere value of 3.

FIG. 8A shows the first virial coefficients, α (labeled as "specific conductivity enhancement" in the figure) for composites containing particles in epoxy. Tested particles included nickel nanospheres, $MgF_2$-coated nickel platelets, nickel microspheres, nickel platelets in a random arrangement, and nickel platelets in an aligned arrangement in the epoxy matrix. As can be seen, we made platelet composites with a thermal conductivity of 1.8 W/m·K (the polymer matrix alone has a thermal conductivity of 0.21 W/m·K). This is a thermal conductivity enhancement of about 8.6 times at only 11 vol. % platelets. Besides mitigating whiskers, platelet coatings can function as heat spreaders.

Dielectric Properties—

Figure 8B:
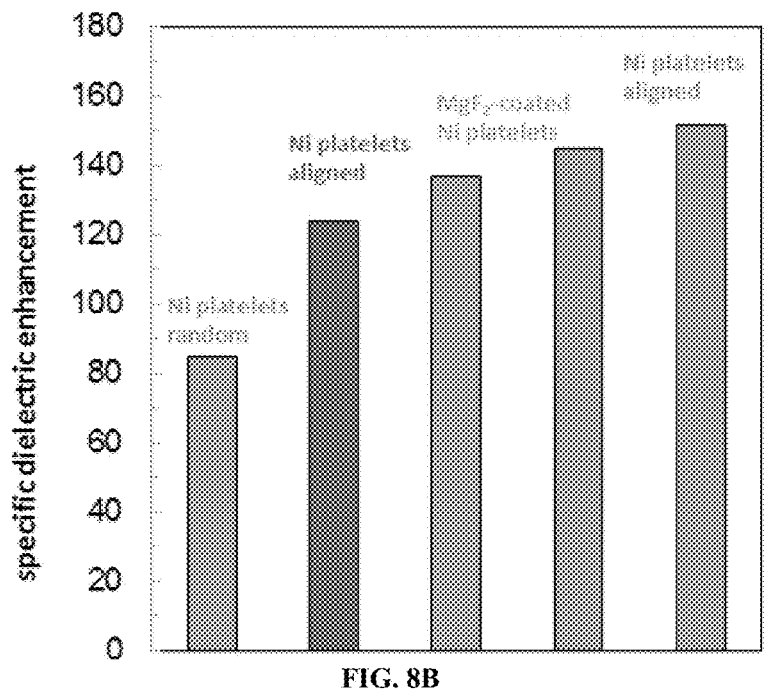

The platelet composite coatings have enhanced dielectric properties, as shown in FIG. 8B. The specific dielectric enhancements for composites made with nickel or $MgF_2$-coated nickel platelets in epoxy are much larger than the sphere value of 3.

We made platelet composites with a dielectric constant of 60 (the polymer matrix alone has a dielectric constant of 4.1). This is a dielectric enhancement of about 14.6 times at only 11 vol. % platelets. These composites are electrically insulating over the range of 1 kHz to 1 MHz.

Figure 9:
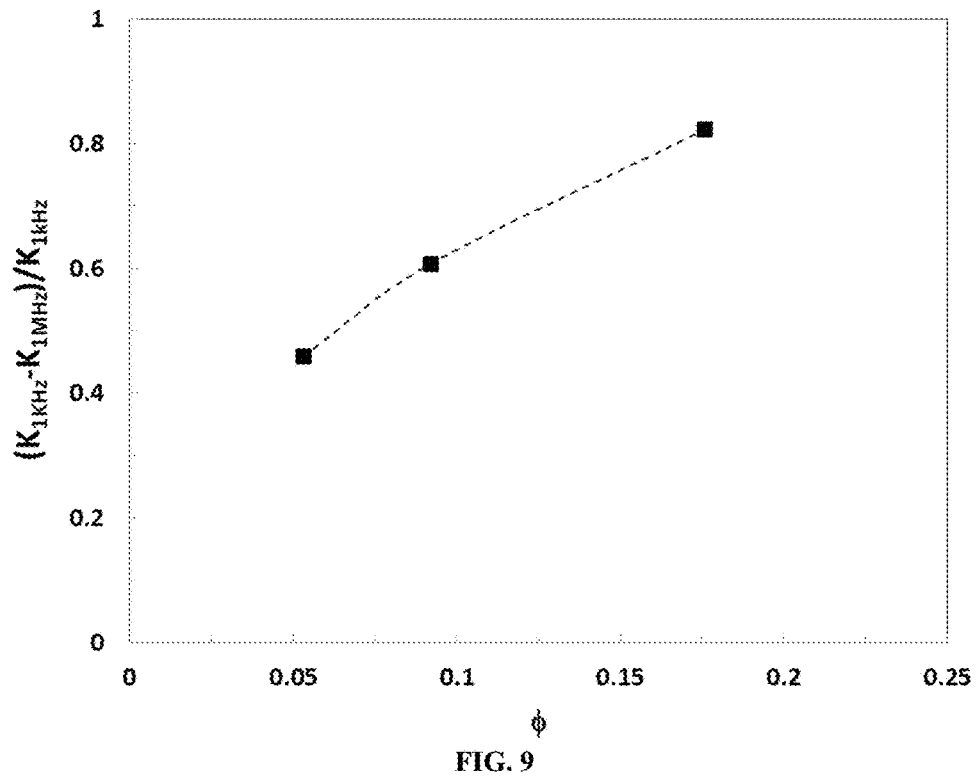
FIG. 9 shows a graph of changes in the dielectric constants from 1 kHz to 1 MHz ($K_{1Hz}$-$K_{1MHz}$)/$K_{1Hz}$ as a function of volume fraction φ, where data are shown for composites made with uncoated nickel platelets.

Whereas $MgF_2$-coated nickel platelets formed electrically insulating composites, composites made with nickel platelets can be tuned to be either electrical insulators or conductors. At platelet loadings ≤10 vol. %, the composites are electrically insulating, and their dielectric constants do not change significantly with frequency. At higher loadings (about 17.6 vol. %), the composite is electrically insulating, but the dielectric constant decreases by about 82% from 1 kHz to 1 MHz (FIG. 9). At ~24 vol. %, the composite behaved like a pure conductor. At high loadings, the resistivity and dielectric constant can depend on frequency f. The resistivity was generally proportional to $f^{-2/3}$. The dielectric constant was less strongly frequency dependent.

Gas Permeability—

Figure 10:
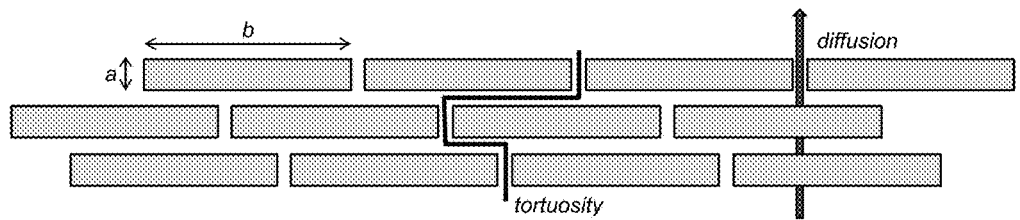
FIG. 10 is a schematic showing a regular arrangement of platelets with their major axes b perpendicular to the diffusion direction.

Platelet composites can reduce the out-of-plane gas permeability, when the platelets are arranged with their major axes b perpendicular to the diffusion direction, as shown in FIG. 10. Besides platelet orientation, the platelet volume fraction and aspect ratio b/a influence the permeability of the composite. Higher aspect ratio platelets increase the tortuosity and give more efficient blocking for a given particle volume (Choudalakis G et al., "Permeability of polymer/clay nanocomposites: A review," *Eur. Polym. J.* 2009; 45:967-84). Gas permeability measurements can be conducted in order to determine the effect of the coating parameters (e.g., ratio b/a, volume fraction φ, or volume percentage vol. %) on permeability of a gas (e.g., $O_2$, $N_2$, He, etc.).

Summary:

Platelet composite coatings comprised of nickel or $MgF_2$-coated nickel platelets in epoxy or silicone were demonstrated and evaluated for tin whisker mitigation. A substantial increase in the penetration resistance occurs for platelets oriented with their director normal to the surface of the coating. Such an orientation presents an impenetrable barrier to the growing whiskers. The coating that results resembles scale armor and can coat surfaces conformally.

Besides penetration resistance, the oriented platelet composites can have enhanced in-plane thermal conductivity and dielectric properties, and reduced out-of-plane gas permeability. They satisfy a need for multifunctional tin whisker mitigation coatings for electronic systems that use tin-plated components or tin-containing solders.

Example 2: Comparison of Platelet Composite Coatings and Other Mitigation Methods We have demonstrated that the platelet composite coatings perform better than unfilled polymer coatings for tin whisker mitigation. In the following, our evaluation of conventional tin whisker mitigation methods is summarized. These other methods include lead (Pb) plating, fusing, and tin-lead solder dipping and are briefly described below.

Lead Plating:

It was discovered in 1959 that relatively small amounts of Pb (3-10 wt. %) co-deposited with tin, suppress tin whisker growth (Galyon G T, "Annotated tin whisker bibliography and anthology," *IEEE Trans. Electron. Packaging Manufact.* 2005 January; 28(1):94-122; Arnold S M, "The growth of metal whiskers on electrical components," *Proc. IEEE Electron. Compon. Conf.* 1959:75-8). For example, tin surfaces that contained 5 wt. % Pb and had micron-sized, regularly shaped grains did not grow whiskers under room temperature aging whereas the Pb-free surfaces did (Kakeshita T et al., "Grain size effect of electro-plated tin coatings on whisker growth," *J. Mat. Sci.* 1982; 17:2560-66). In another study, the addition of Pb to tin changed the morphology of the tin grains from elongated to equiaxed, reducing the compressive stresses in the tin (Boettinger W J et al., "Whisker and hillock formation on Sn, Sn—Cu, and Sn—Pb electrodeposits," *Acta Materialia* 2005; 53:5033-50). The addition of Pb to pure tin plating has been shown to significantly prolong the incubation time of tin whiskers.

Fusing:

Fusing was proposed in 1966 for tin whisker mitigation (Arnold S M, "Repressing the growth of tin whiskers," *Plating* 1966; 53(1):96-9). Fused Tin Plated Surfaces have large (a few microns), regularly shaped grains that are less likely to grow whiskers than unfused tin plating which typically has sub-micron, irregularly shaped grains (Sengupta S et al., "Effects of re-finishing terminations by solder-dipping on plastic quad flatpack electronic parts," *Proc. 7th Electron. Packaging Technol. Conf.*, held on 7-9 Dec. 2005, vol. 2, pp. 768-73). Fusing involves dipping the tin leads into a hot oil bath or reflowing the tin in an oven, followed by cooling slowly to form large grains.

Solder Dipping:

This technique involves coating the tin surfaces with flux, preheating, then dipping into a molten Sn—Pb or Pb-free solder bath. The bath temperature and time in the bath must be optimized to promote solder wetting of the tin and to avoid thermal damage to the device (Sengupta S et al., "Effects of re-finishing terminations by solder-dipping on plastic quad flatpack electronic parts," *Proc. 7th Electron. Packaging Technol. Conf.*, held on 7-9 Dec. 2005, vol. 2, pp. 768-73).

Results:

We tested these mitigation methods on commercial capacitors, transistors, and coil inductors in three environments: long-term storage, temperature-humidity conditions (at 60° C. with 93% RH), and temperature cycling condition (cycling from −55° C. to 85° C.).

Fusing prevented whisker growth in long-term storage, but whiskers grew from fused tin under temperature-humidity and thermal cycling conditions. In fact, whiskers from fused surfaces ended up growing longer than from unfused surfaces. Fused tin grew longer whiskers under temperature-humidity than temperature cycling for coil inductors and transistors. Whisker growth increased between 1,500 and 4,000 hours at 60° C., 93% RH; and between 500 and 2,000 temperature cycles (−55° C. to 85° C.).

Pb plating and Sn—Pb solder dipping prevented whisker growth in long-term storage, but whiskers grew during temperature-humidity and thermal cycling conditions.

Summary:

Platelet composite coatings survived years of ambient storage, various temperature-humidity conditions (i.e., 4,000 hours at 60° C. and 93% RH, as well as 500 hours at 85° C. and 85% RH), and temperature cycling conditions (i.e., 1,500 cycles from −55° C. to 85° C.) without whisker penetration. None of the other mitigation methods that we evaluated (unfilled polymer coating, lead plating, fusing, tin-lead solder dipping) prevented whisker growth in all of these environments.

Example 3: Thermal Mechanical Analysis of Composite Coatings

Figure 6A:
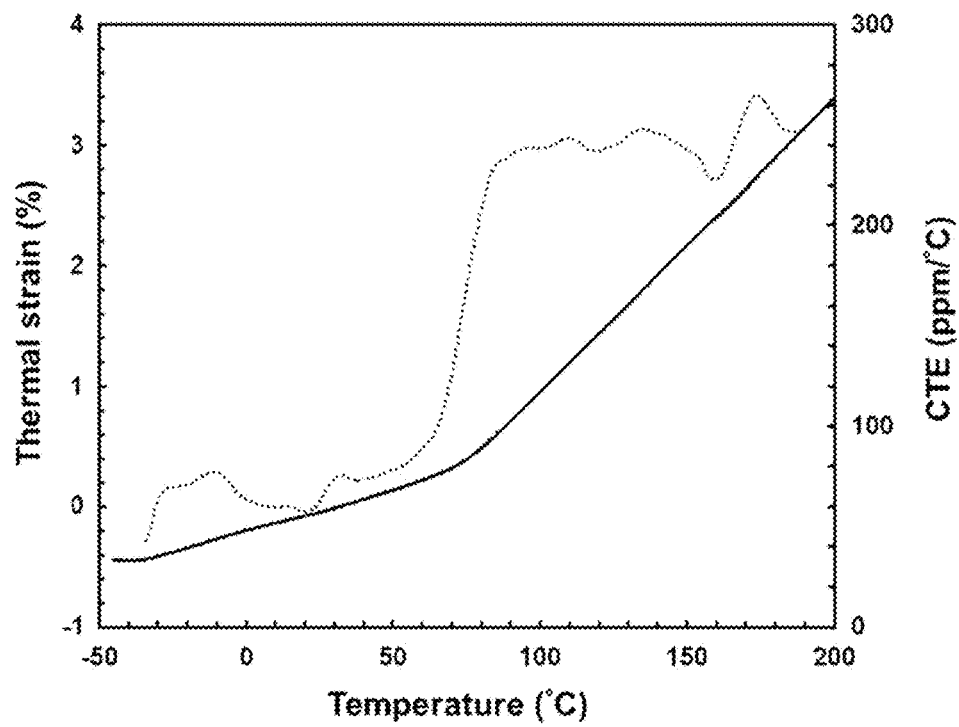
FIG. 6A-6D shows thermal analysis of platelet-filled coatings. Provided is (A) a graph showing the thermal strain (solid line) and coefficient of thermal expansion (dotted line) from −45° C. to 200° C. of a composite containing 2 vol. % Type I Ni platelets in epoxy resin. Also provided are simulation images of (B) a spherical particle, (C) a gradient-aligned elliptical particle, and (D) a misaligned elliptical particle and their effects on thermal flux.

The thermal properties of composite coatings were studied. FIG. 6A provides data for a composite mixture having a distinct glassy transition ($T_g$ of about 60° C.).

The nickel loading in our composites has a negligible effect on the coefficient of thermal expansion CTE and the glass transition temperature $T_g$. Even though CTE increases significantly above $T_g$, CTE mismatch stresses nearly vanished because the elastic modulus decreased by a factor of about 300.

Figure 6B:
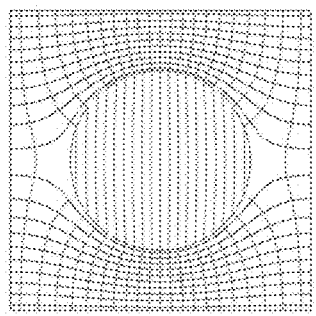
Figure 6C:
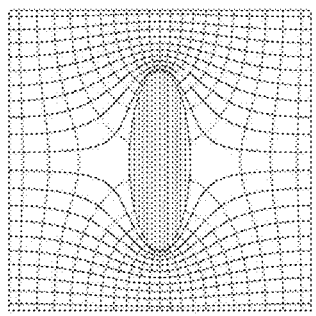
Figure 6D:
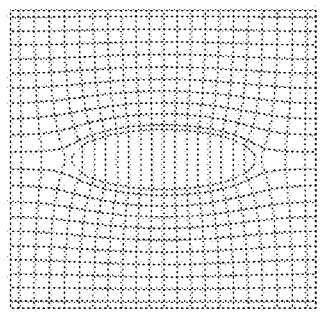

In addition, thermal conductivity of coating can be further enhanced by choosing particles having appropriate dimensions and alignment. In particular, platelets can provide exceptional property enhancements in composites (FIG. 6B-6D). Thermal interface materials are typically made by adding thermally conductive, spherical particles to a polymer resin. Only modest conductivity enhancements accrue, because a sphere almost completely excludes the thermal gradient (FIG. 6B, where thermal flux lines are provided as generally horizontal lines traversing around the spherical cross-section and isotherms are provided as generally vertical lines traveling through the spherical cross-section). Methods of approximating and modeling conduction characteristics are described in Martin J E et al., "Anisotropic charge and heat conduction through arrays of parallel elliptic cylinders in a continuous medium," *J. Appl. Phys.* 2013; 113(14):144907 (8 pages), which is incorporated herein by reference in its entirety.

Aligned platelets do not effectively exclude the thermal gradient and so are a much more effective shape. As can be seen, a spherical particle gives only a modest increase in thermal flux (FIG. 6B). A gradient-aligned elliptical particle gives a more pronounced flux increase (FIG. 6C), and a misaligned elliptical particle gives almost no flux increase (FIG. 6D). Accordingly, the cross-sectional dimensions and length scales of a particle can be tested to understand the thermal conductivity of a resultant conformal coating, as well as design such coatings with desired thermal conductivity characteristics.

Example 4: Platelet Composite Coatings for Tin Whisker Mitigation

Abstract:

Reliable methods for tin whisker mitigation are needed for applications that use tin-plated commercial components. Tin can grow whiskers that can lead to electrical shorting, possibly causing critical systems to fail catastrophically. The mechanisms of tin whisker growth are unclear, and this makes prediction of the lifetimes of critical components uncertain. The development of robust methods for tin whisker mitigation is one beneficial approach to eliminating the risk of shorting. Current mitigation methods are based on unfilled polymer coatings that are not impenetrable to tin whiskers. Here, we report tin whisker mitigation results for several filled polymer coatings. The whisker-penetration resistance of the coatings was evaluated at elevated temperature and high humidity and under temperature cycling conditions. The composite coatings comprised Ni and $MgF_2$-coated Al/Ni/Al platelets in epoxy resin or silicone rubber. In addition to improved whisker mitigation, these platelet composites had enhanced thermal conductivity and dielectric constant compared with unfilled polymers. Additional details follow.

Introduction

Lead-free electronics initiatives have resulted in a shift to pure tin plating on commercial components. Unfortunately, tin can grow whiskers that can lead to electrical shorts or metal vapor arcing, both of which can cause critical systems to fail catastrophically (see, e.g., McDowell M E, "Tin whiskers: A case study," 1993 *IEEE Aerospace Appl. Conf Dig.* 1993:207-15; Brusse J A et al., "Tin whiskers: Attributes and mitigation," *Proc. 22$^{nd}$ Capacitor and Resistor Technol. Symp.*, held on 25-29 Mar. 2002, pp. 67-80, available at http://nepp.nasa.gov/whisker/reference/tech_papers/ brusse2002-paper-tin-whiskers-attributes-an d-mitigation. pdf (last accessed 23 Oct. 2014); and Lindborg U, "A model for the spontaneous growth of zinc, cadmium and tin whiskers," *Acta Metallurgica* 1976; 24:181-6). Tin whiskers are a threat to the reliability of electronic systems used in military, aerospace, automotive, telecommunications, and medical applications. The development of robust methods for tin whisker mitigation is needed to address this risk.

Most mitigation methods focus on reducing compressive stress in the tin which is believed to be the force driving whisker growth. Such methods include alloying with Pb or Bi to change the microstructure of the tin; annealing the tin immediately after plating; and matte tin plating, which because of its large grain size (>5 μm), is less prone to whisker growth than bright tin plating, which has small grains and high residual film stress (see, e.g., Puttlitz K J et al., "Impact of the ROHS Directive on high-performance electronic systems—Part II: key reliability issues preventing the implementation of lead-free solders," *J. Mater. Sci.: Mater. Electron.* 2007; 18:347-65). Unfortunately, these methods eventually lose their effectiveness, especially when exposed to harsh environments (e.g., thermal cycling, elevated temperature, and/or high humidity).

Polymer coatings that conform to the geometry of the components are currently being investigated for tin whisker mitigation. This work has focused on conformal coatings that were developed to protect electronics from moisture permeation, particulates, etc. Such coatings are based on both glassy and rubbery unfilled polymers, for example polyurethane, acrylic, and silicone rubber, but these have not proved to be impenetrable to tin whiskers (see, e.g., Panashchenko L et al., "Long term investigation of urethane conformal coating against tin whisker growth," *IPC Tin Whisker Conf.*, held on 7 Dec. 2010 (31 pages), available at http://nepp.nasa.gov/whisker/reference/tech_papers/2010- Panashchenko-IPC-Tin-Whisker.pdf (last accessed 22 Oct. 2014); Woodrow T A et al., "Evaluation of conformal coatings as a tin whisker mitigation strategy," *IPC/JEDEC 8th International Conference on Lead-Free Electronic Components and Assemblies*, held on 18-20 Apr. 2005 at San Jose, Calif. (25 pp.), available at http://nepp.nasa.gov/whisker/reference/tech_papers/2005-woodrow-tin-whisker-conformal-coat-study.pdf (last accessed 27 Oct. 2015); Woodrow T A et al., "Evaluation of conformal coatings as a tin whisker mitigation strategy, Part II," *Proceedings of SMTA International Conference*, held on 24-28 Sep. 2006 at Rosemont, Ill. (33 pp.), available at http://nepp.nasa.gov/whisker/ reference/tech_papers/2006-Woodrow-Conformal-Coating-PartII.pdf (last accessed 27 Oct. 2015); Hunt C et al., "Mitigation of tin whiskers with polymer coatings," *International Symposium on Advanced Packaging Materials: Microtech*, 2010, held on 28 Feb.-2 Mar. 2010, held in Cambridge, United Kingdom, pp. 78-87; and Han S et al., "Evaluation of effectiveness of conformal coatings as tin whisker mitigation," *J. Electron. Mat.* 2012; 41(9):2508-18). For example, a 1 mil thick coating of Uralane® 5750 at 50° C./50% relative humidity (RH) was penetrated by tin whiskers after 5 years, as were 1 mil thick acrylic coatings. Rubbery polymers were found to have lower penetration resistance in humid environments.

Unfilled glassy polymers have greater penetration resistance than unfilled rubbery polymers; and in fact, tin whiskers did not penetrate a 0.5 mil (1 mil is one thousandth of an inch) thick Parylene C coating after 5 years at 50° C./50% RH and after sequential thermal cycling, elevated temperature-humidity, and exposure to corrosive gas (see, e.g., Panashchenko L et al., "Long term investigation of urethane conformal coating against tin whisker growth," *IPC Tin Whisker Conf.*, held on 7 Dec. 2010 (31 pages), available at http://nepp.nasa.gov/whisker/reference/tech_papers/2010-Panashchenko-IPC-Tin-Whisker.pdf (last accessed 22 Oct. 2014); Woodrow T A et al., "Evaluation of conformal coatings as a tin whisker mitigation strategy, Part II," *Proceedings of SMTA International Conference*, held on 24-28 Sep. 2006 at Rosemont, Ill. (33 pp.), available at http://nepp.nasa.gov/whisker/reference/tech_papers/2006-Woodrow-Conformal-Coating-PartII.pdf (last accessed 27 Oct. 2015); and Han S et al., "Evaluation of effectiveness of conformal coatings as tin whisker mitigation," *J. Electron. Mat.* 2012; 41(9):2508-18). However, stress evolution during thermal cycling remains an issue for some glassy polymers, so in this regard rubbery polymers are preferred.

In this Example, we investigated the use of platelet-shaped particles as filler materials for whisker mitigation. These were dispersed in both rubbery and glassy polymers, specifically silicone rubber and epoxy resin. We chose platelets because they have a higher cross section than spherical particles at a given loading, and are thus more likely to stop the growing whiskers. When arranged into sheet-like layers with magnetic fields, the platelets create a multilayer barrier resembling that found in nature. In fact, multilayer platelet composites are the reason for the high fracture toughness of seashells and the penetration resistance of the toucan beak (see, e.g., Meyers M A et al., "Structural biological materials: Critical mechanics-materials connections," *Science* 2013 February; 339(6121):773-9).

Platelets have already been shown to enhance a variety of properties of composites, for example thermal conductivity, magnetic permeability, dielectric permittivity, and mechanical properties (see, e.g., Meyers M A et al., "Structural biological materials: Critical mechanics-materials connections," *Science* 2013 February; 339(6121):773-9; Martin J E et al., "Field-structured composites for efficient, directed heat transfer," *J. Appl. Phys.* 2009; 106:084301 (7 pp.); Hill R F et al., "Thermal conductivity of platelet-filled polymer composites," *J. Am. Ceram. Soc.* 2002; 85:851-7; Yu A et al., "Graphite nanoplatelet-epoxy composite thermal interface materials," *J. Phys. Chem. C* 2007; 111:7565-9; Zhu B L et al., "Study on the properties of the epoxy-matrix composites filled with thermally conductive AlN and BN ceramic particles," *J. Appl. Polym. Sci.* 2010; 118:2754-64; Corcione C E et al., "Transport properties of graphite/epoxy composites: thermal, permeability and dielectric characterization," *Polym. Test.* 2013; 32:880-8; Min C et al., "A graphite nanoplatelet/epoxy composite with high dielectric constant and high thermal conductivity," *Carbon* 2013; 55:116-25; Bonderer L J et al., "Strong and ductile platelet-reinforced polymer films inspired by nature: Microstructure and mechanical properties," *J. Mater. Res.* 2009; 24:2741-54; Guevara-Morales A et al., "Mechanical and dielectric properties of epoxy-clay nanocomposites," *J. Mater. Sci.* 2014; 49:1574-84; and Yao H B et al., "Artificial carbonate nanocrystals and layered structural nanocomposites inspired by nacre: synthesis, fabrication and applications," *Adv. Mater.* 2014; 26:163-88)

They also reduce gas permeability (see, e.g., Corcione C E et al., "Transport properties of graphite/epoxy composites: thermal, permeability and dielectric characterization," *Polym. Test.* 2013; 32:880-8; Ebina T et al., "Flexible transparent clay films with heat-resistant and high gas-barrier properties," *Adv. Mater.* 2007; 19:2450-3; Ogasawara T et al., "Helium gas permeability of montmorillonite/epoxy nanocomposites," *Composites Part A* 2006; 37:2236-40; Priolo M A et al., "Super gas barrier of transparent polymer-clay multilayer ultrathin films," *Nano Lett.* 2010; 10:4970-4; Choudalakis G et al., "Permeability of polymer/clay nanocomposites: A review," *Eur. Polym. J.* 2009; 45:967-84; and Van Rooyen L J et al., "Helium gas permeability reduction of epoxy composite coatings by incorporation of glass flakes," *J. Membr. Sci.* 2013; 430:203-10).

Tin whisker mitigation coatings for electronic systems must satisfy some general criteria, e.g., one or more criteria listed in Table 1. Besides penetration resistance, the coatings should be chemically and thermally stable; have low outgassing; be electrically insulating; bond strongly to the materials they are applied to; withstand thermal cycling without creating undue stresses on the components; provide a moisture barrier; function as a heat spreader; and/or have low permeability to gases that could accelerate aging of the underlying materials. The platelet composite coatings we are developing satisfy many of these criteria and are thus ideal candidates for a new class of mitigation coating for Pb-free electronics.

TABLE 1

Exemplary criteria for coatings used for tin whisker mitigation in Pb-free electronics

| | |
|---|---|
| Penetration resistant | Low outgassing |
| Chemically stable | Low stress |
| Thermally stable | Electrically insulating |
| Moisture resistant | Heat spreading |
| Strong bonding/adhesion | Low gas permeability |

Experimental

Figure 12A:
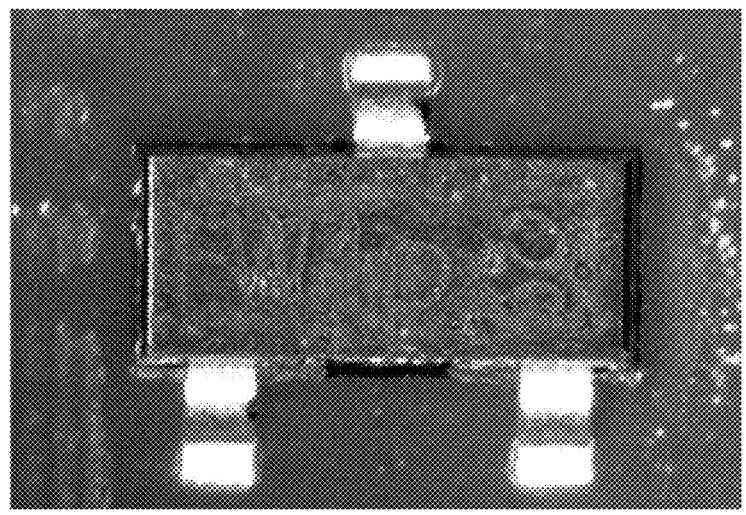
FIG. 12A-12B shows pictures of components used in the tin whisker mitigation studies herein, including (A) a transistor and (B) a capacitor.
Figure 12B:
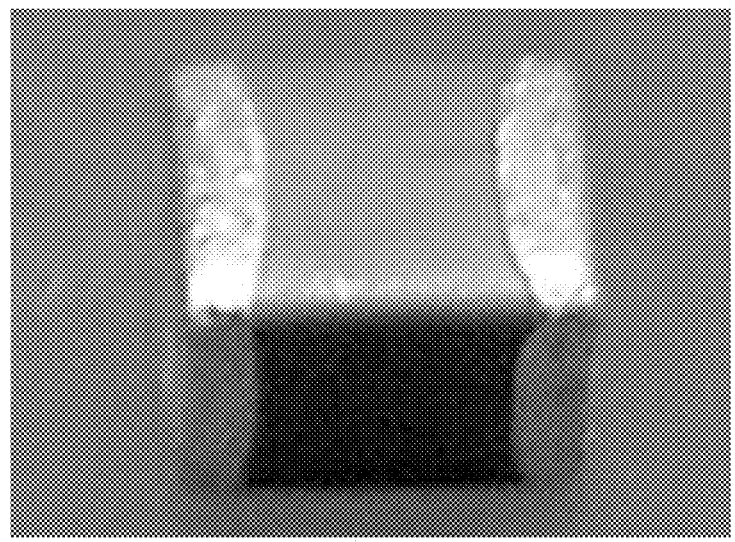

Components:

The components used in our tin whisker mitigation studies are shown in FIGS. 12A-12B and described in Table 2. In our experiments, the components were exposed to long-term storage and accelerated aging conditions that have been shown to promote tin whisker growth and are recommended by the International Electronics Manufacturing Initiative (see, e.g., Suganuma K et al., "Sn whisker growth during thermal cycling," *Acta Mater.* 2011; 59:7255-67; Schroeder V et al, "Tin whisker test method development," *IEEE Trans. Electron Packaging Manuf.* 2006; 29:231-8; and Vo N et al., "Tin whisker test standardization," *IEEE Trans. Electron Packaging Manuf.* 2005; 28:3-9): 1,500 temperature cycles (from −55° C. to 85° C.); and 4,000 h at 60° C. and 93% relative humidity (RH). Scanning electron microscopy (SEM) in secondary and back-scattered electron (BSE) imaging modes were used to inspect the components for tin whiskers.

TABLE 2

Description of the components evaluated in this Example

|  | Transistor | Capacitor |
|---|---|---|
| Size | 3.0 mm × 1.4 mm × 1.0 mm | 3.3 mm × 2.6 mm × 2.0 mm |
| Description | SOT23 package | 1210 chip component |
| Tin components | Matte tin leads | Tin terminations |
| Tin thickness | 8-10 µm tin thickness | 5-10 µm tin thickness |
| Other material | Base material: Fe (60%), Ni (40%) | Interior Cu termination, Ni barrier |

Figure 13A:
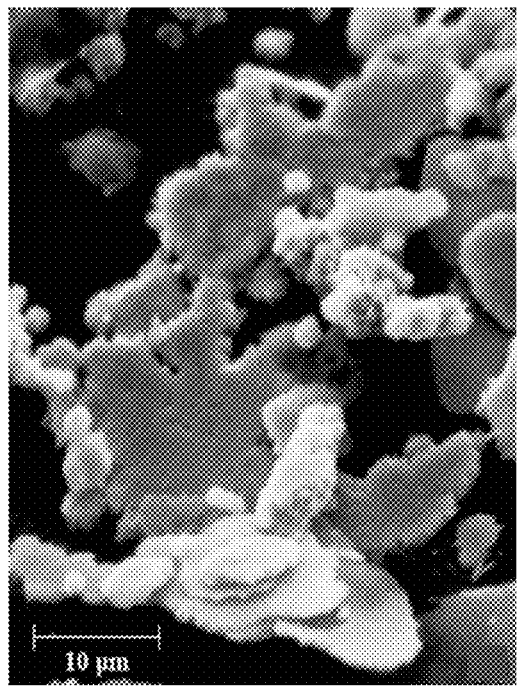
FIG. 13A-13B shows SEM images of the platelets that were used in filled polymer composite coatings, including (A) nickel platelets from Novamet and (B) $MgF_2$-coated Al/Ni/Al platelets from JDSU Flex Products. Scale bar=50 μm in (B).
Figure 13B:
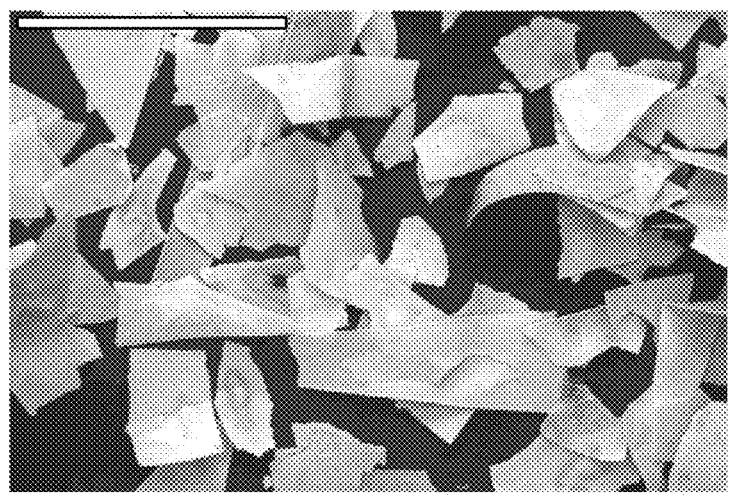

Composite Fabrication:

Epoxy resin (EPON® 828 with Jeffamine® T-403 curing agent) and silicone rubber (Gelest® PP2-OE41) were used for the unfilled polymer and polymer composite coatings. The composite coatings contained commercial nickel platelets (non-leafing and leafing grade) from Novamet Specialty Products Corp. (Lebanon, Tenn.) and $MgF_2$-coated Al/Ni/Al platelets from JDSU Flex Products (Milpitas, Calif.). SEM images of the platelets are shown in FIG. 13A-13B. The uncoated Ni platelets were irregularly shaped and did not have very high aspect ratios. The $MgF_2$-coated Al/Ni/Al platelets are engineered for optical applications, and are thus distinctly different in structure. They include a 60-nm Ni core, which is coated on both sides with 80 nm Al and then with 200 nm layers of $MgF_2$. The platelets were mixed into the polymers, and the mixture was degassed and then applied to the components with a brush, which was then cured at 55-60° C. The coating thickness was about 1 mil to 2.5 mil, which is in the range recommended by the IPC-CC-830B industry standard for conformal coatings.

Tin-plated copper coupons were also used in some evaluations. The coupons were coated with epoxy resin or Ni platelet-filled epoxy resin. The penetration resistance of Ni was evaluated by using tin-plated copper coupons. In these experiments, the copper was first plated with Ni, then tin, and then with a final overlayer of Ni.

Thermal Conductivity and Capacitance Measurements:

To fabricate bulk composite samples for thermal diffusivity and capacitance measurements, the platelet-epoxy resin mixture was degassed before pouring into a 1-cm-square cuvette. After curing of the epoxy resin at 60° C., a 1.5 mm thick×1 cm square composite suitable for laser flash thermal diffusivity measurements was machined. Thermal conductivity was calculated from measured thermal diffusivity. The dielectric constants were calculated from capacitance measurements of these composites. The capacitance of the composites was measured from 1 kHz to 1 MHz by use of an LCR (inductance (L), capacitance (C), resistance (R)) bridge.

Results and Discussion

Platelet composite coatings were evaluated for tin whisker mitigation on commercial capacitors and transistors. The penetration resistance of the platelet-filled polymers was compared to that of the unfilled polymers under long-term storage, thermal cycling, and elevated-temperature, high-humidity conditions. The first part of the study established a baseline for tin whisker growth by using control components. The first important observation was that tin whiskers were observed on all of the components, and most whiskers grew to be 10-20 µm long, irrespective of aging condition. We did not find a clear correlation between the aging condition and maximum whisker length. The length of the longest whisker is known to be highly variable and unpredictable (see, e.g., Brusse J, "Tin whisker observations on pure tin-plated ceramic chip capacitors," *Proceedings of the Annual International Technical Conference for the American Electroplaters and Surface Finishers Society*, held on 24-27 Jun. 2002 at Chicago, Ill., available at http://nepp.nasa.gov/whisker/reference/tech_papers/brusse2002-paper-tin-whiskers-observed-on-ceramic-capacitor.pdf (last accessed 27 Oct. 2015)).

The longest whisker was 25 µm on the capacitors that were stored for 7.5 years. Those exposed to 4,000 h at 60° C., 93% relative humidity also had a maximum whisker length of 25 µm. The longest whisker found on a capacitor subjected to 1500 thermal cycles (−55° C. to 85° C.) was 75 µm. For transistors, the longest whiskers found were 24 µm, 40 µm, and 35 µm, after 5 years of storage; 4,000 h at 60° C./93% relative humidity; and 1,500 thermal cycles (−55° C. to 85° C.).

Figure 14:
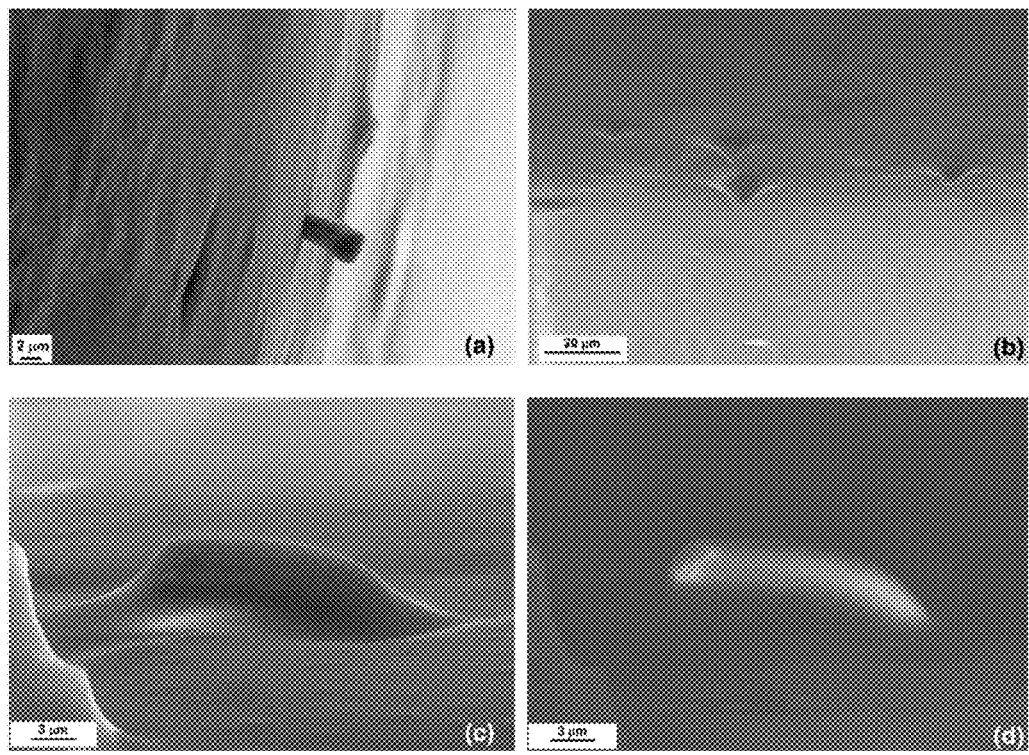
FIG. 14 shows SEM images of conformal coatings on capacitors after storage for 7.5 years at variable temperature and humidity. (a) A whisker has penetrated the coating and others (b) have created projections in the coating. (c) A protrusion which BSE imaging revealed was created by a tin whisker (d).

Tin Whisker Mitigation Results:

Even under moderately accelerated aging conditions, tin whiskers eventually penetrate unfilled polymers. Tin whiskers were observed on epoxy re-sin-coated capacitors exposed to 7.5 years of variable temperature and humidity conditions (out-of-doors in closed containers, e.g., the electronics in an automobile parked outside all year would experience similar conditions). Some of the whiskers penetrated the polymer (FIG. 14(*a*)). Tin whiskers also created projections in the polymer and caused localized debonding (FIG. 14(*b*)). Other protrusions such as that shown in FIG. 14(*c*) were observed. The tin whisker that created the protrusion can be seen beneath the coating in BSE imaging mode (FIG. 14(*d*)).

Preliminary Penetration-Resistance Studies:

Tin-plated copper coupons were used to test the whisker-penetration resistance of an Ni film and Ni platelet-filled epoxy resin. The coupons were plated in a manner that led to abundant whisker growth (FIG. 4A).

Figure 4E:
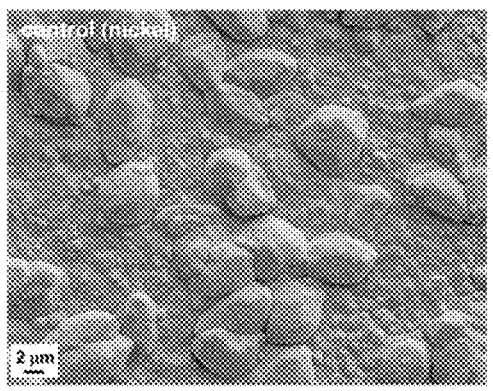

For Ni film penetration-resistance experiments, the copper was first plated with Ni, then tin, and then with a final overlayer of Ni. The Ni overlayer was 500 nm thick, which is comparable with the thickness of a platelet. No whiskers were observed after 3.5 years of laboratory storage, as shown in the SEM image in FIG. 4E, only Ni grains were seen. Even after the coupons had been thermally cycled (500 cycles from −55° C. to 125° C. plus 1,000 cycles from −55° C. to 85° C.), the 500 nm-thick Ni overlayer resisted penetration.

Next, tin-plated copper coupons were coated with Ni platelet-filled epoxy resin; no whiskers were observed after four years of laboratory storage. Finally, capacitors and transistors were coated with the platelet composites and exposed to accelerated aging conditions. The results of the accelerated aging experiments are discussed herein.

Elevated Temperature and High-Humidity Environment:

Epoxy resin and silicone rubber-based composites containing two types of platelet were tested: Ni non-leafing and $MgF_2$-coated Al/Ni/Al platelets. After 4,000 h at 60° C. and 93% RH, there was no evidence of tin whiskers penetrating the epoxy resin or silicone rubber coatings that contained these platelets. Interestingly, whisker penetration was negligible for components coated with the unfilled epoxy resin (whiskers were observed on one transistor and none of the capacitors), and no whiskers had penetrated the unfilled silicone rubber on the capacitors or the transistors. After storage for 4,000 h, abundant whisker growth was observed on the uncoated control components, so longer aging times are thus required to evaluate the penetration resistance of the coated components under elevated temperature and high-humidity conditions.

Temperature Cycling Environment:

Unfilled silicone rubber and epoxy resin coatings were tested on capacitors and transistors during thermal cycling. After 500 cycles, tin whiskers had penetrated both polymers (FIG. 4B-4C). We also observed protrusions in the coatings where whiskers were trying to penetrate. Upon re-inspection after 1,500 cycles, more whiskers had penetrated both polymers.

Three types of platelet were used in thermal cycling experiments with composite coatings: Ni leafing (Type I), Ni non-leafing (Type II), and MgF$_2$-coated Al/Ni/Al.

Figure 15:
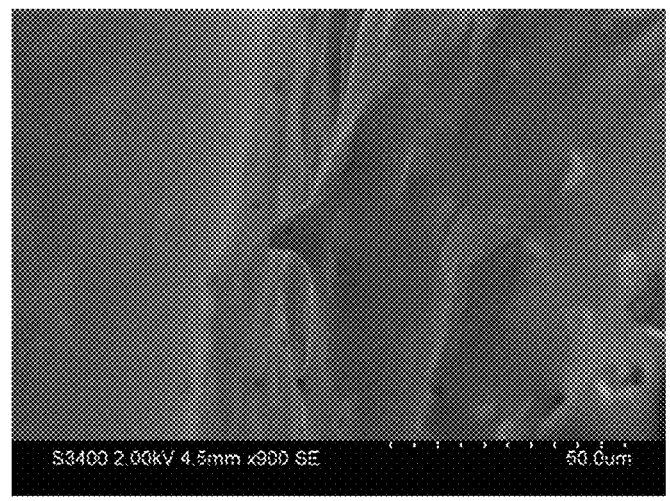
FIG. 15 is an SEM image of a platelet composite coating containing 4 vol. % of Type II Ni platelets in epoxy resin after 500 temperature cycles. Platelets that are oriented out of the plane of the tin surface can create protrusions in the polymer.

Conductive Non-Leafing-Grade Ni Platelets (Type II):

Composite coatings were fabricated with non-leafing Ni platelets in epoxy resin and tested on capacitors and transistors attached to printed-circuit boards. Non-leafing platelets were polymer wettable and, as a result, were dispersed throughout the thickness of the coating and oriented at arbitrary angles. Although no tin whiskers penetrated the composites after 1,500 temperature cycles (−55° C. to 85° C.), some platelets were oriented out of the plane of the tin surface, creating protrusions in the polymers, as shown in FIG. 15, for example.

MgF$_2$-Coated Al/Ni/Al Platelets:

MgF$_2$-coated platelets (2-4 vol. %) were added to epoxy resin and silicone rubber. At higher platelet loadings, platelets that were oriented out of the plane of the coating were observed and sometimes created protrusions in the polymer. No tin whiskers were observed on the coated capacitors or transistors after 1,500 temperature cycles (−55° C. to 85° C.).

Figure 5D:

Conductive Leafing-Grade Ni Platelets (Type I):

Type I Ni platelets were similar in size and shape to the Type II platelets, but their surfaces are coated with a ligand, for example stearic acid, which causes dewetting of the epoxy resin. As a result, the platelets arrange themselves with their major axes parallel to the coating surface and rise to the surface of the polymer to form a sheet-like layer. The coating that results was conformal. FIG. 5A shows a transistor coated with epoxy resin containing 4 vol. % platelets, which survived 1,500 temperature cycles without whisker penetration. The platelets retained their orientation throughout the temperature-cycling experiments (FIG. 5C), and the coating was crack-free. A cross-section of a coated transistor lead showed the platelet leafing effect at the coating surface (FIG. 5D).

The thermal strain of a composite containing 2 vol. % of Type I Ni platelets was measured over a broad temperature range by thermomechanical analysis, and was plotted with the coefficient of thermal expansion (CTE) in FIG. 6A. The Ni loading had a negligible effect on the CTE of the polymer (~70 ppm/° and 75 ppm/° at room temperature for the unfilled and filled epoxy resin, respectively). The thermal strain curve had a distinct glassy transition at ~70° C. The CTE of the composite increased substantially above $T_g$, but the CTE mismatch stresses between the coating and the tin nearly vanished because the elastic modulus of the composite decreased by a factor of ~300 (from ~3 GPa to ~12 MPa).

Thermal Conductivity of Platelet Composites

Increasing the in-plane thermal conductivity of the composites would result in coatings that could function as heat spreaders. The usual approach to increasing the thermal conductivity of polymers is to add particles comprised of a material that has vastly higher thermal conductivity than the polymer. This high contrast approach gives disappointing results when the particles are spherical because the spherical shape strongly excludes the imposed thermal gradient. The thermal flux density through a sphere is thus limited to four times that through the pure polymer. A platelet is a more effective shape for filler particles. The thermal flux density in a platelet can be extremely large, especially when the platelet is aligned with its major axis parallel to the imposed thermal gradient (see, e.g., Martin J E et al., "Anisotropic charge and heat conduction through arrays of parallel elliptic cylinders in a continuous medium," *J. Appl. Phys.* 2013; 113:144907 (8 pp.)).

The platelet-filled composites have better thermal conductivity than the polymer, even at low loadings. For example, the effective thermal conductivity $K_{eff}$ of a composite containing 11.1 vol. % Ni leafing (Type I) platelets in epoxy resin was 1.8 W/m·K—an 8.6-fold increase over the thermal conductivity of the pure epoxy resin (0.21 W/m·K). This enhancement can be attributed to the in-plane orientation of the leafing platelets.

The $K_{eff}$ of Ni non-leafing (Type II) platelet composites did not reach the $K_{eff}$ obtained from type I platelet composites, even at a platelet loading of 24 vol. % ($K_{eff}$=1.4 W/m·K). The $K_{eff}$ data for all of the platelet composites studied in this work are listed in Table 3 and are plotted in FIG. 7 with $K_{eff}$ for Ni sphere-filled epoxy resin composites as a function of particle volume fraction. At ~28 vol. % loading, the $K_{eff}$ value of a Ni sphere-filled composite was 0.875 W/m·K. At 57.6 vol. % loading, the $K_{eff}$ value was 3.08 W/m·K. Composites prepared with such high loadings had a paste-like rheology that would be unsuitable for coating applications.

Furthermore, high loadings are not required if the platelets are organized with electric or magnetic fields in such a way as to maximize the thermal conductivity of the composite along the intended thermal gradient (see, e.g., Martin J E et al., "Field-structured composites for efficient, directed heat transfer," *J. Appl. Phys.* 2009; 106:084301 (7 pp.); Solis K J et al., "Field-structured magnetic platelets as a route to improved thermal interface materials," *J. Appl. Phys.* 2012; 111:073507 (10 pp.); and Martin J E et al., "Field-structured, multilayered platelets enable high performance, dielectric thermal composites," *J. Appl. Phys.* 2012; 112:054306 (10 pp.).

TABLE 3

Thermal conductivities and dielectric constants for platelet composites

| Sample | Vol. % | Thermal conductivity (W/m · K) | Dielectric constant @ 1 kHz |
|---|---|---|---|
| Ni platelets, type II | 5.3 | 0.307 | 22.5 |
| Ni platelets, type I | 5.2 | 0.418 | 36.4 |
| Ni platelets, type I | 11.1 | 1.83 | 60.4 |
| MgF$_2$-coated Al/Ni/Al platelets | 2.8 | 0.233 | 19.8 |
| MgF$_2$-coated Al/Ni/Al platelets | 4.8 | 0.423 | 32.6 |
| Ni platelets, type I* | 6.4 | 0.619 | 118 |
| Ni platelets, type II* | 9.2 | 0.431 | 51.2 |
| Ni platelets, type II* | 17.6 | 0.783 | 261.3 |
| Ni platelets, type II | 24 | 1.41 | N/A |

The dielectric constant was calculated from the capacitance measured at 1 kHz. Composites having dielectric constants that are frequency-dependent are indicated with an asterisk (*).

Electrical Properties of Platelet Composites

For use as tin whisker mitigation coatings for electronics, the platelet composites must, in some but not all instances, be electrically insulating. Platelet composites made with Type II Ni platelets were electrical insulators at platelet loadings ≤17.6 vol. %, with dielectric constants much larger than that of epoxy resin (4.1). At ~24 vol. %, the composite behaved like a pure conductor. The Type I Ni platelet composites at ≤11 vol. % loadings also behaved as electrical insulators with enhanced dielectric constants. The measured dielectric constants for the composites are listed in Table 3.

Figure 16A:
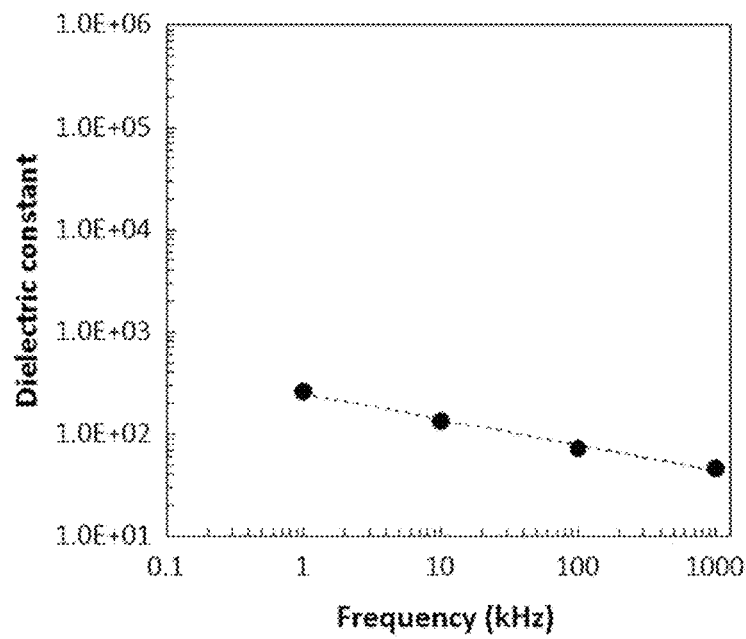
FIG. 16A-16B shows graphs of frequency dependence of the (A) dielectric constant and (B) resistivity of a Type II Ni platelet-filled composite.
Figure 16B:
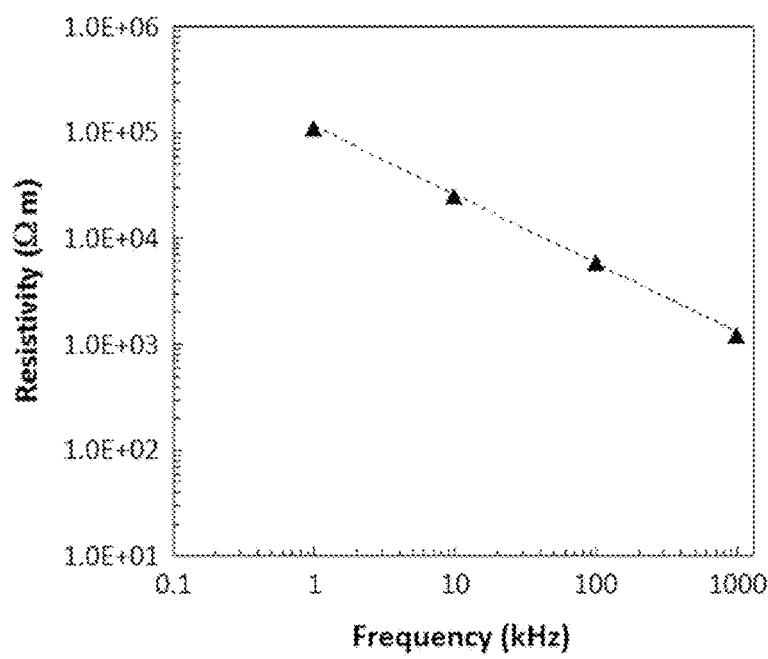

Some of the composites had frequency-dependent dielectric constants. For example, the dielectric constant of the 17.6 vol. % Type II Ni platelet composite decreased by ~82% from 1 kHz to 1 MHz, as shown in FIG. 16A. This unwanted frequency dependence, which was observed for both Ni leafing and non-leafing platelet composites indicated incipient electrical conductivity. The dielectric constant was less strongly frequency-dependent than the resistivity, which varies over several decades, as shown in FIG. 16B.

The composites containing 2.8 vol. % and 4.8 vol. % $MgF_2$-coated Ni platelets behaved as electrical insulators with dielectric constants of 136.7 and 144.8, respectively. The $MgF_2$ coating prevents electrical conduction even at high platelet loadings. We also produced electrically insulating composites with frequency-independent dielectric constants over the measured range of 20 Hz to 1 MHz. At platelet loadings of 11.5 vol. % and 20.5 vol. %, the dielectric constants were 71.2±1.12 and 91.31±16.06, respectively. The platelets described in this Example (multilayer $MgF_2/Al/Ni/Al/MgF_2$) were organized into chains in epoxy resin by use of a magnetic field. Uncoated pure Ni platelets structured in the same manner led to composites that behaved as electrical conductors: at a platelet loading of 10%, the composite resistivity was 0.62Ω·m. Field structuring led to platelet overlap, creating more contact area for charge conduction.

Figure 17A:
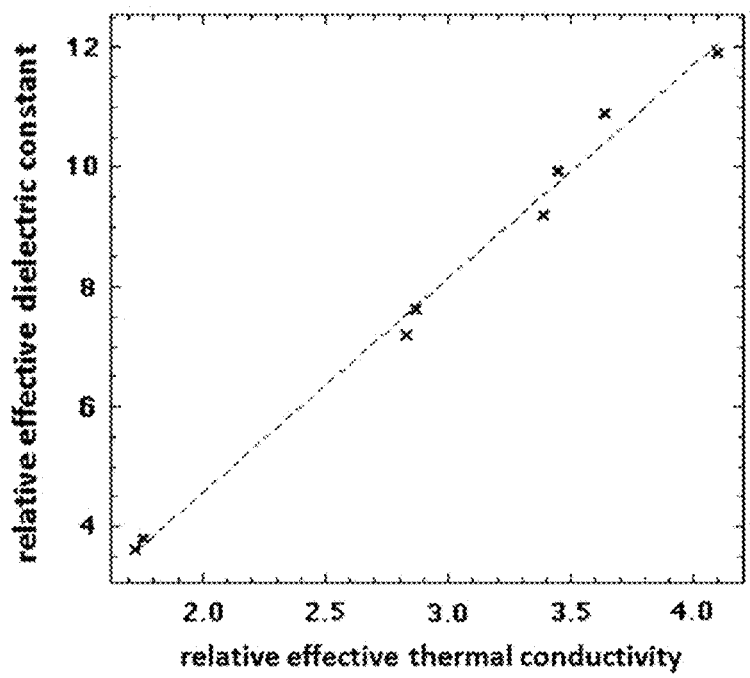
FIG. 17A-17B shows graphs of enhancements of the dielectric constant and thermal conductivity of composites structured by a uniaxial magnetic field and containing (A) Type II Ni platelets and (B) MgF$_2$/Al/Ni/Al/MgF$_2$ platelets.
Figure 17B:
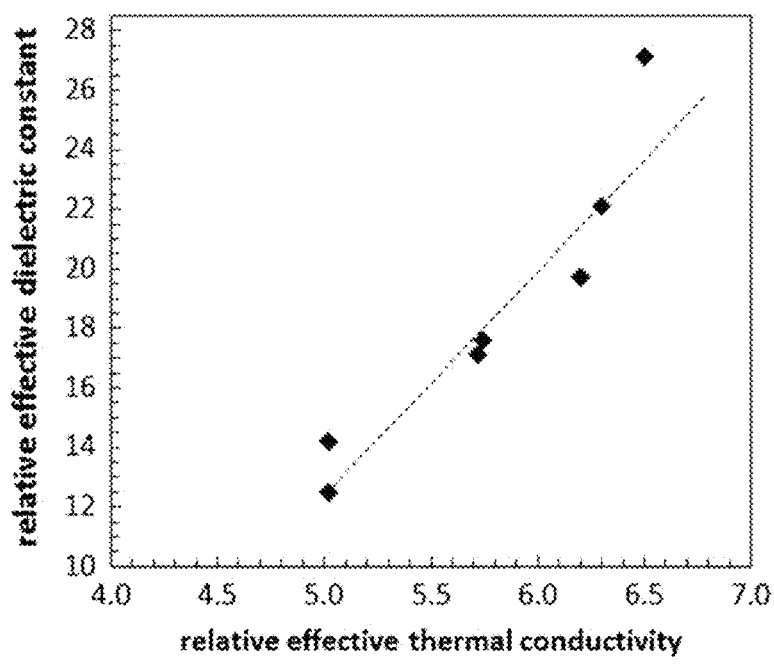

The thermal conductivity and the dielectric constant are isomorphic properties because these properties can be computed from a scalar field (temperature, electrostatic potential) that is a solution to Laplace's equation (see, e.g., Batchelor G K, "Transport properties of two-phase materials with random structure," *Annu. Rev. Fluid Mech.* 1974; 6:227-55). It would thus be expected that the enhancements of these properties would be comparable, but this was not observed. FIG. 17A-17B compares the relative effective properties of magnetic field-structured composites containing Type II Ni platelets and $MgF_2/Al/Ni/Al/MgF_2$ platelets, respectively. The dielectric enhancements are larger than the thermal enhancements because the Kapitza resistance blocks thermal transport by creating thermal discontinuities at the platelet-polymer interface.

TABLE 4

Performance of different mitigation methods at 60° C. and 93% RH for 4,000 h

| Mitigation method | Results |
| --- | --- |
| Fusing | Sn whiskers observed after 4,000 h (longest 70 μm) |
| Sn-Pb solder dipping | Sn whiskers 3-8 μm long were observed after 4,000 h |
| Pb plating | Sn whiskers observed after 4,000 h (longest 8 μm) |
| Epoxy resin coating | Negligible whisker penetration after 4,000 h |
| Silicone rubber coating | No whisker penetration after 4,000 h |
| Platelet-filled epoxy resin coating | No whisker penetration after 4,000 h |
| Platelet-filled silicone rubber coating | No whisker penetration after 4,000 h |

Comparison of Platelet Composite Coatings with Other Mitigation Methods

Three other mitigation methods were investigated in this work: fusing, solder dipping, and Pb plating. These approaches are described as follows:

Fusing:

Fusing refers to heating the tin above its melting temperature (rv232° C.), then cooling slowly to form large grains (see, e.g., Arnold S M et al., "Filamentary growths on metals at elevated temperatures," *J. Appl. Phys.* 1956; 27:964-5; Kakeshita T et al., "Grain size effect of electroplated tin coatings on whisker growth," *J. Mater. Sci.* 1982; 17:2560-6; Smetana J, "Theory of tin whisker growth: 'The end game'," *IEEE Trans. Electron. Packaging Manuf.* 2007; 30:11-22; and Osenbach J W et al., "Sn whiskers: material, design, processing, and post-plate reflow effects and development of an overall phenomenological theory," *IEEE Trans. Electron. Packaging Manuf.* 2005; 28:36-62). Large (a few microns), regularly shaped tin grains are less prone to whisker growth than unfused tin, which typically has submicron, irregularly shaped grains (see, e.g., Puttlitz K J et al., "Impact of the ROHS Directive on high-performance electronic systems—Part II: key reliability issues preventing the implementation of lead-free solders," *J. Mater. Sci.: Mater. Electron.* 2007; 18:347-65).

Solder Dipping:

The solder dipping method involves coating the tin surfaces by dipping them into a molten solder bath (see, e.g., Sengupta S et al., "Effects of re-finishing of terminations by solder-dipping on plastic quad flatpack electronic parts," *Proceedings of the 7th Electronic Packaging Technology Conference*, held on 7-9 Dec. 2005 in Singapore, vol. 2, pp. 768-73; Mathew S et al., "Assessment of solder-dipping as a tin whisker mitigation strategy," *IEEE Trans. Compon. Packaging Manuf. Technol.* 2011; 1:957-63; and Dittes Metal., "Tin whisker formation in thermal cycling conditions," *5th Conference Electronics Packaging Technology*, held on 10-12 Dec. 2003 at Singapore, pp. 183-8). In this study, Sn—Pb solder was used. Solder whiskers typically take longer to form and do not grow as long as tin whiskers.

Pb Plating:

Relatively small amounts of Pb (3-10 wt. %) co-deposited with tin suppress tin whisker growth (see, e.g., Arnold S M et al., "Filamentary growths on metals at elevated temperatures," *J. Appl. Phys.* 1956; 27:964-5; Kakeshita T et al., "Grain size effect of electro-plated tin coatings on whisker growth," *J. Mater. Sci.* 1982; 17:2560-6; Galyon G T, "Annotated tin whisker bibliography and anthology," *IEEE Trans. Electron. Packaging Manuf.* 2005; 28:94-122; and Boettinger W J et al., "Whisker and hillock formation on Sn, Sn—Cu and Sn—Pb electrodeposits," *Acta Mater.* 2005; 53:5033-50) by changing the morphology of the tin grains from elongated to equiaxed, reducing the compressive stresses in the tin (see, e.g., Boettinger W J et al., "Whisker and hillock formation on Sn, Sn—Cu and Sn—Pb electrodeposits," *Acta Mater.* 2005; 53:5033-50).

These mitigation methods were applied to capacitors and transistors. Some of these were exposed for 4,000 h at 60° C. and 93% RH; and others were exposed to 1,500-2,000 temperature cycles (−55° C. to 85° C.). Under elevated temperature and high humidity conditions, tin whiskers eventually grew from the fused, solder dipped and the Pb plated components.

Under thermal cycling conditions, whiskers were observed on the fused, solder dipped, Pb plated, and unfilled epoxy resin and silicone rubber-coated components. Table 4 and Table 5 summarize the results of the mitigation experiments under both accelerated aging conditions. The platelet composite coating is the only mitigation method found to work well under both accelerated aging conditions.

TABLE 5

Performance of mitigation methods under 255° C. to 85° C. temperature cycling

| Mitigation method | Results |
| --- | --- |
| Fusing | Whiskers found (longest 7 µm after 500 cycles; 30 µm after 1,500 cycles) |
| Sn-Pb solder dipping | Whiskers observed (longest 13 µm) after 2,000 cycles |
| Pb plating | Whiskers observed (longest 20 µm) after 2,000 cycles |
| Epoxy resin coating | Sn whiskers penetrated after 500 cycles |
| Silicone rubber coating | Sn whiskers penetrated after 500 cycles |
| Platelet-filled epoxy resin coating | No whisker penetration after 1,500 cycles |
| Platelet-filled silicone rubber coating | No whisker penetration after 1,500 cycles |

Summary

The change to pure tin plating on commercial components has created an immediate threat to the long-term reliability of electronic systems for weapons, satellites, military, telecommunications, and automotive applications. The unpredictable nature of tin whisker growth complicates lifetime predictions, so robust mitigation methods are needed. We have tested unfilled and platelet-filled epoxy resin and silicone rubber coatings for tin whisker mitigation on tin-plated capacitors and transistors under long-term storage, temperature-humidity, and temperature cycling conditions.

Tin whisker growth on control capacitors and transistors was monitored as a function of aging conditions. The whiskers did not typically grow longer than 20 µm, irrespective of aging conditions. The longest whisker was 75 µm and was found on a temperature-cycled capacitor.

After 500 temperature cycles (from −55° C. to 85° C.), tin whiskers had penetrated both the silicone rubber and the epoxy resin coatings on capacitors. The polymer composite coatings, which comprised Ni or $MgF_2$-coated Al/Ni/Al platelets in epoxy resin and silicone rubber, withstood 1,500 temperature cycles and 4,000 h at 60° C., 93% RH without whisker penetration. Platelet composites made with Ni platelets can be electrical insulators or conductors. At platelet loadings ≤10 vol. %, the composites were electrically insulating and their dielectric constants did not change substantially with frequency. At higher loadings (~17.6 vol. %), the composites were electrically insulating, but the dielectric constant decreased by ~82% in the frequency range from 1 kHz to 1 MHz. At ~24 vol. % loading, the composite behaves like a pure conductor. Platelet composites made with 2.8 vol. % and 4.8 vol. % of $MgF_2$-coated Al/Ni/Al platelets were electrical insulators.

Addition of platelets increased the thermal conductivity and dielectric constant of the composites. The effective thermal conductivity of an electrically insulating composite containing 11 vol. % Ni leafing platelets in epoxy resin was 1.8 W/m·K (0.21 W/m·K for epoxy resin alone). The enhanced thermal conductivity enabled the coatings to function as heat spreaders. The dielectric constant of this composite was 60, whereas epoxy resin alone is 4.1. Platelet composite coatings performed better than fusing, solder dipping, and Pb plating mitigation methods under accelerated aging conditions.

Example 5: Permeability of Composite Coatings

Composite coatings can also be modified to provide desired permeability characteristics. For instance, gas permeability can be reduced by controlling the loading of the platelets (e.g., as characterized by vol. % within a polymer matrix), the directionality of the alignment or orientation of the platelet particles, and/or the length scale(s) of the platelet particle. As seen in Table 6, gas permeability of both water vapor and oxygen was reduced by employing a composite coating having aligned platelets. Gas permeability was measured at 30° C. with 60% RH for determining the water vapor transmission rate (WVTR); and at 100% $O_2$ with 60% RH for oxygen transmission rate (OTR) tests. As can be seen, even with low loadings, the Ni platelet composite had lower WVTR and OTR than the unfilled epoxy coating.

TABLE 6

Water vapor and oxygen permeability of composite coatings

| Sample | Vol. % | Water Vapor Transmission Rate (g/100 in² · day) | Oxygen Transmission Rate (cc/100 in² · day) |
| --- | --- | --- | --- |
| Epoxy | — | 0.089 | 6.80 |
| Ni platelets (aligned) | 2.0 | 0.0559 | 4.17 |

Other Embodiments

All publications, patents, and patent applications mentioned in this specification, including U.S. Provisional Application No. 62/072,300, filed Oct. 29, 2014, are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A conductive component comprising:
    a metal layer formed from a whisker-forming material; and
    a conformal coating disposed on at least a portion of the metal layer, wherein the coating further comprises:
        a matrix comprised of one or more polymers; and
        a plurality of externally alignable metallic particles embedded in the matrix, wherein an average projection of a particle director, which is a unit vector, normal to a surface of the metal layer is greater than about 0.8.

2. The component of claim 1, wherein the conformal coating is characterized by an order parameter S that is more than about 0.75.

3. The component of claim 1, wherein the whisker-forming material is tin.

4. The component of claim 1, wherein the matrix comprises epoxy, silicone, polyurethane, acrylic, or combinations thereof.

5. The component of claim 4, wherein the plurality of externally alignable metallic particles consists essentially of platelets, flakes, or combinations thereof.

6. The component of claim 4, wherein each externally alignable metallic particle comprises a major axis having a length scale b that is of from about 2 µm to about 200 µm, wherein each particle comprises a minor axis having a length scale a that is of from about 0.5 µm to about 2 µm, and wherein b is greater than a.

7. The component of claim 6, wherein the ratio of b to a of from about 1000:1 to about 5:1.

8. The component of claim 6, wherein the ratio of b to a is greater than about 1:1.

9. The component of claim 1, wherein the plurality of externally alignable metallic particles comprises one or more of metallic particles, magnetic particles, or combinations thereof.

10. The component of claim 1, wherein each externally alignable metallic particle comprises a coating.

11. The component of claim 10, wherein the coating comprises a dielectric, a magnesium fluoride, a polyethylene glycol, a polyethylene oxide, a silica, a ceramic, and/or a fatty acid.

12. The component of claim 1, wherein the conformal coating comprises of from about 2 vol. % to about 10 vol. % externally alignable metallic particles.

13. The component of claim 12, wherein the conformal coating comprises a thickness of from about 5 µm to about 200 µm.

14. The component of claim 1, wherein the conformal coating comprises a plurality of layers embedded within the matrix, and wherein each layer comprises a plurality of externally alignable metallic particles.

15. The component of claim 1, wherein the conformal coating has beneficial penetration resistance, chemical stability, thermal stability, moisture resistance, low outgassing, low stress, high electrical insulation, thermal conductivity, and/or low gas permeability.

16. The component of claim 15, wherein the conformal coating has a thermal conductivity of greater than about 1 W/m·K and/or a specific conductivity enhancement of greater than about 50.

17. The component of claim 15, wherein the conformal coating has a specific dielectric enhancement of greater than about 100.

18. The component of claim 1, wherein the component is a capacitor, a transistor, or an inductor.

19. The component of claim 1, wherein a contact angle between the matrix and a surface of the particle is more than about 90°.

* * * * *